United States Patent
Dayal et al.

(10) Patent No.: US 10,893,628 B2
(45) Date of Patent: Jan. 12, 2021

(54) CIRCUIT BOARD COOLING

(71) Applicant: InvenSense, Inc., San Jose, CA (US)

(72) Inventors: Sankalp Dayal, Fremont, CA (US); Vamshi Gangumalla, Saratoga, CA (US); Zaryab Hamavand, San Jose, CA (US); Calin Miclaus, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 184 days.

(21) Appl. No.: 16/246,296

(22) Filed: Jan. 11, 2019

(65) Prior Publication Data

US 2019/0150316 A1    May 16, 2019

Related U.S. Application Data

(63) Continuation-in-part of application No. 16/104,868, filed on Aug. 17, 2018.

(60) Provisional application No. 62/576,425, filed on Oct. 24, 2017, provisional application No. 62/626,645, filed on Feb. 5, 2018.

(51) Int. Cl.
| | |
|---|---|
| *H05K 7/20* | (2006.01) |
| *G01F 1/88* | (2006.01) |
| *H05K 7/14* | (2006.01) |
| *G06F 1/3296* | (2019.01) |
| *G06F 1/3228* | (2019.01) |

(52) U.S. Cl.
CPC .......... *H05K 7/20209* (2013.01); *G01F 1/88* (2013.01); *G06F 1/3228* (2013.01); *G06F 1/3296* (2013.01); *H05K 7/1487* (2013.01); *H05K 7/1489* (2013.01); *H05K 7/20172* (2013.01); *H05K 7/20727* (2013.01); *H05K 7/20736* (2013.01); *H05K 7/20836* (2013.01)

(58) Field of Classification Search
CPC .......... H05K 7/20836; H05K 7/20172; H05K 7/20209; H05K 7/20736; H05K 7/20727; H05K 7/20; G01F 1/34; G01F 1/88; G06F 1/20; G06F 1/206
USPC ...................................... 361/679.46–679.48
See application file for complete search history.

(56) References Cited

U.S. PATENT DOCUMENTS

| | | | |
|---|---|---|---|
| 6,747,872 B1 * | 6/2004 | Patel | G06F 1/206 361/695 |
| 2003/0221821 A1 * | 12/2003 | Patel | G05D 1/0255 165/247 |
| 2004/0020225 A1 * | 2/2004 | Patel | F25B 49/02 62/229 |

(Continued)

*Primary Examiner* — Mischita L Henson

(57) ABSTRACT

A circuit board cooling system comprises a cooling unit comprising fans, pressures sensors that measure air pressure at their locations, and a sensor processing unit coupled with the pressure sensors. The cooling unit operates according to an operating configuration and generates air flow to cool a portion of a circuit board. The pressure sensors comprise a first pressure sensor located between the portion of the circuit board and the cooling unit; and a second pressure sensor located such that the portion of the circuit board is between the second pressure sensor and the cooling unit. A sensor processing unit is configured to: obtain the air pressure data measured by the plurality of pressure sensors; and adjust the operating configuration of the cooling unit based on a cooling specification and a comparison of the obtained air pressure data measured by the first pressure sensor and the second pressure sensor.

23 Claims, 14 Drawing Sheets

(56) References Cited

U.S. PATENT DOCUMENTS

| | | | |
|---|---|---|---|
| 2004/0065097 A1* | 4/2004 | Bash | H05K 7/20836 62/180 |
| 2006/0168975 A1* | 8/2006 | Malone | H05K 7/20836 62/180 |
| 2008/0055850 A1* | 3/2008 | Carlson | H05K 7/20727 361/695 |
| 2016/0227675 A1* | 8/2016 | North | G06F 1/20 |
| 2017/0160775 A1* | 6/2017 | Sun | F24F 11/79 |
| 2017/0181328 A1* | 6/2017 | Shelnutt | H05K 7/20781 |
| 2019/0150316 A1* | 5/2019 | Dayal | G06F 1/3296 361/679.48 |

* cited by examiner

RACK UNIT
110

1200

OBTAIN AIR PRESSURE DATA MEASURED BY A PLURALITY OF PRESSURE SENSORS DISPOSED WITHIN A RACK UNIT, WHERE THE PLURALITY OF PRESSURE SENSORS INCLUDES: A FIRST PRESSURE SENSOR LOCATED BETWEEN A PORTION OF A CIRCUIT BOARD AND A COOLING UNIT WHICH GENERATES AIRFLOW OVER THE CIRCUIT BOARD, THE FIRST PRESSURE SENSOR CONFIGURED TO MEASURE AIR PRESSURE DATA AT A LOCATION OF THE FIRST PRESSURE SENSOR; AND A SECOND PRESSURE SENSOR LOCATED SUCH THAT THE PORTION OF THE CIRCUIT BOARD IS BETWEEN THE SECOND PRESSURE SENSOR AND THE COOLING UNIT, THE SECOND PRESSURE SENSOR CONFIGURED TO MEASURE AIR PRESSURE DATA AT A LOCATION OF THE SECOND PRESSURE SENSOR
1210

ADJUST AN OPERATING CONFIGURATION OF THE COOLING UNIT BASED ON A COOLING SPECIFICATION AND A COMPARISON OF THE OBTAINED AIR PRESSURE DATA MEASURED BY THE FIRST PRESSURE SENSOR AND THE SECOND PRESSURE SENSOR
1220

FIG. 12

CIRCUIT BOARD COOLING

CROSS REFERENCE TO RELATED APPLICATIONS—CONTINUATION IN PART

This application is a continuation-in-part application of and claims priority to and benefit of co-pending U.S. patent application Ser. No. 16/104,868 filed on Aug. 17, 2018 entitled "AIR FLOW DISTURBANCE DETERMINATION IN A COOLING SYSTEM" by Sankalp Dayal et al., and assigned to the assignee of the present application, the disclosure of which is hereby incorporated herein by reference in its entirety.

U.S. patent application Ser. No. 16/104,868 claimed priority to and benefit of U.S. Provisional Patent Application No. 62/576,425 filed on Oct. 24, 2017 entitled "Air Flow Measurement in a Server Using Pressure Sensor" by Zaryab Hamavand and Calin Miclaus, which is assigned to the assignee of the present application. The disclosure of U.S. Provisional Patent Application No. 62/576,425 is hereby incorporated herein by reference in its entirety.

U.S. patent application Ser. No. 16/104,868 claimed priority to and benefit of U.S. Provisional Patent Application No. 62/626,645 filed on Feb. 5, 2018 entitled "Device and Method for Optimizing Cooling by Measuring Air Flow and Temperature Using Pressure Sensors" by Sankalp Dayal and Vamshi Gangumalla, which is assigned to the assignee of the present application. The disclosure of U.S. Provisional Patent Application No. 62/626,645 is hereby incorporated herein by reference in its entirety.

CROSS REFERENCE TO RELATED APPLICATIONS—PROVISIONAL

This application claims priority to and benefit of U.S. Provisional Patent Application No. 62/626,645 filed on Feb. 5, 2018 entitled "Device and Method for Optimizing Cooling by Measuring Air Flow and Temperature Using Pressure Sensors" by Sankalp Dayal and Vamshi Gangumalla, which is assigned to the assignee of the present application. The disclosure of U.S. Provisional Patent Application No. 62/626,645 is hereby incorporated herein by reference in its entirety.

BACKGROUND

Electronic equipment like servers, laptops, etc. typically requires cooling air to cool processing units (e.g., central processing units (CPUs), graphics processing units (GPUs)), memory (e.g., Random Access Memory (RAM)), and other electronic components. Absent sufficient cooling air, these electronic components could overheat and become damaged. In an item of electronic equipment, such as a server, cooling air is typically provided by a cooling unit which includes one or more fans. The fan(s) can consume 25% to 30% of total power consumed by the system in which the cooling unit operates. This power consumed by the cooling unit, in particular by its fan(s), in turn results in significant portion of the overall cost of operation of most any item of electronic equipment that includes a cooling unit. It follows that in a single piece of electronic equipment, such as a single server, cooling costs can comprise a large portion of the overall operating costs and maintaining adequate cooling air to cooled components is important. Similarly, for entities operating a large number of pieces of electronic equipment (such as servers in a server farm), the cost of cooling is significant and the importance of maintaining adequate cooling air to cooled electronic components is also significant.

BRIEF DESCRIPTION OF DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

FIG. 12 illustrates a flow diagram of an example method operating a cooling unit which includes a plurality of fans, in accordance with various embodiments.

DESCRIPTION OF EMBODIMENTS

Figure 1:
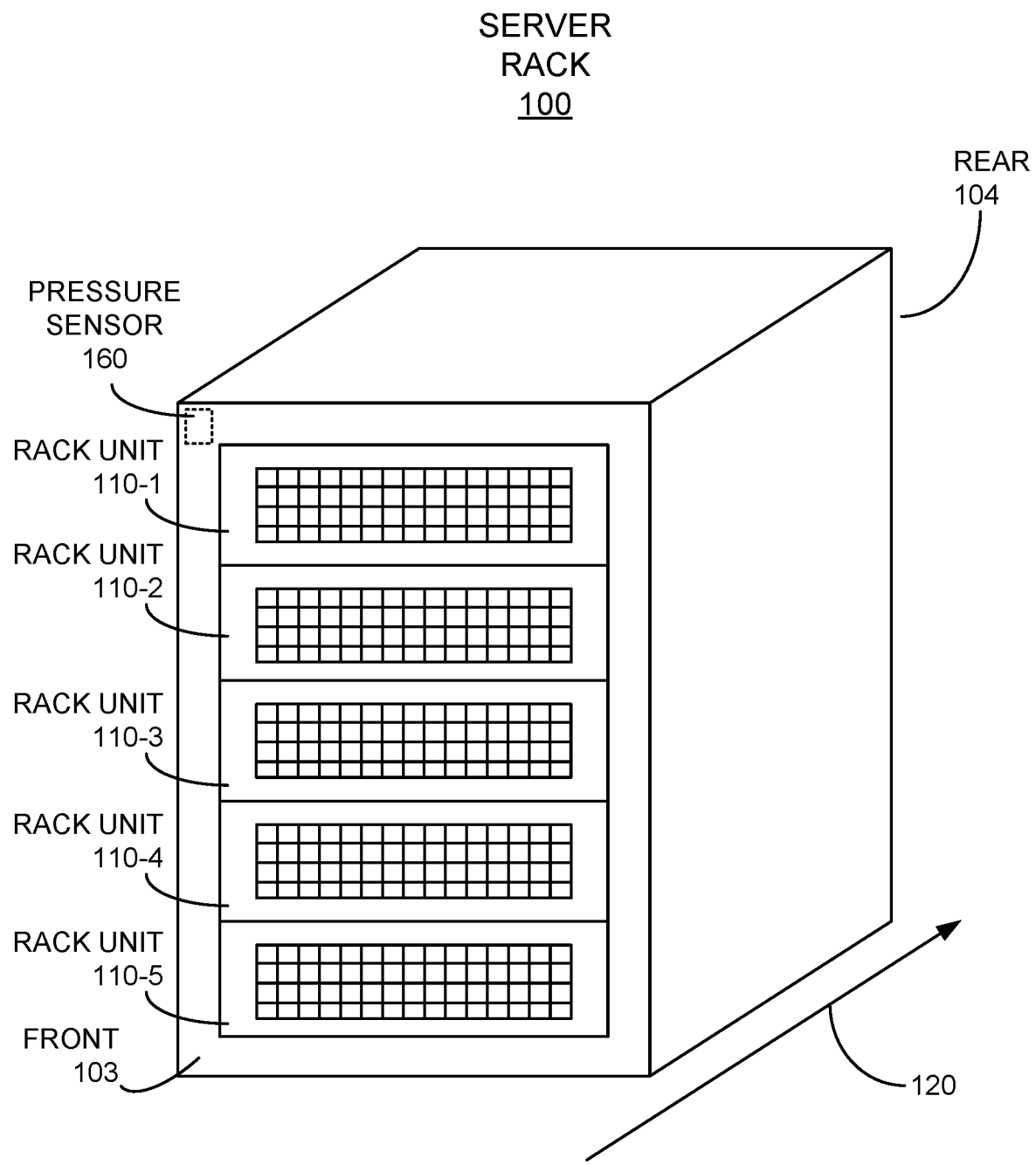
FIG. 1 illustrates an example server rack, in accordance with various embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of electrical or magnetic signals capable of being stored, transferred, combined, compared, and otherwise manipulated in an electronic device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "measuring," "obtaining," "comparing," "determining," "storing," "operating," "adjusting," or the like, refer to the actions and processes of an electronic device such as: a sensor processing unit, a sensor processor, a host processor, a processor, a sensor, a memory, or the like, or a combination thereof. The electronic device manipulates and transforms data represented as physical (electronic and/or magnetic) quantities within the electronic device's registers and memories into other data similarly represented as physical quantities within the electronic device's memories or registers or other such information storage, transmission, processing, or display components.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example electronic device(s) such as servers described herein may include components other than those shown, including well-known components.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable data storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as one or more sensor processing units (SPUs), sensor processor(s), host processor(s) or core(s) thereof, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A processor may be a microprocessor, but in the alternative, the processor may be any conventional processor, controller, microcontroller, or state machine. A processor may also be implemented as a combination of computing devices, e.g., a combination of an SPU and a microprocessor, a plurality of microprocessors, one or more microprocessors in conjunction with an SPU core, or any other such configuration.

Overview of Discussion

Example embodiments described herein, improve the usability of electronic equipment such as computers, servers, and racks of electronic equipment. In some embodiments, improvements realized from the technology described herein may increase power efficiency of the cooling unit of an item of electronic equipment, provide an ability to detect a disturbance to cooling air in an item of electronic equipment, provide an ability to detect a location of a disturbance to cooling air in an item of electronic equipment, or a combination of the foregoing.

Cooling units in electronic equipment like servers may have multiple fans that can operate at multiple speeds. An "operating configuration" of a cooling unit is a configuration of the speed(s) at which the fans in a cooling unit are set to operate. In a cooling unit, selecting which set of fans to turn on (i.e., operate at more than 0% of possible speed) and at what speeds they must be operated, results in different amounts of power consumed by the cooling unit during different operating configurations. An optimized operating configuration of fan(s), and their speeds, should maintain the right amount of airflow on the areas which are getting heated while keeping the power consumption as low as possible and/or maintaining the required temperature for the electronic equipment and one or more of its components. If more than required air is blown, it is waste of power and if air is blown in the areas where no cooling is required, it is also waste of power. A cooling unit may have one or more operating configurations. For example, a cooling unit in one server may have a first operating configuration that uses less power when a processor of the server is operated at 50% of its capacity and second operating configuration which creates more air flow and uses more power when the processor is operated at 100% of its capacity. Different operating configurations may include different required or desired (maximum) operating temperatures. An operating configuration may be stored in a memory of the cooling unit or accessible to the cooling unit, or may be supplied to the cooling unit.

A "cooling specification" specifies an objective to be achieved by an operating configuration of a cooling unit. Without limitation thereto, a cooling specification may specify objectives such as: temperature of one or more cooled circuit board portions, power use by a cooling unit, pressure drop over one or more cooled circuit board portions, air flow past one or more cooled portions of a circuit board, or some other objective or combination of objectives. For example, in one embodiment, a cooling specification may specify that an operating configuration (e.g., fan speeds) of a cooling unit be set such that the minimum power possible is consumed by the cooling unit while still maintaining a portion of a circuit board at a predetermined temperature. In another embodiment, a cooling specification may specify that that an operating condition (e.g., fan speeds) of a cooling unit is selected such that a target air flow or air pressure is met for one or more portions of a circuit board. In yet another embodiment, a cooling specification may specify a power allowance to run the fans, and the operating configuration is adapted to maximize processor load for the given power allowance.

Electronic equipment like servers are highly configurable, however this highly regarded feature can also have drawbacks. Sometimes modifications, especially unplanned, poorly planned, or ad hoc modifications, can reduce power efficiency loss due to airflow bottlenecks (drag, obstructions, turbulences etc.). Put differently, a stock server configuration may not have the best cooling efficiency after customization/modification in the field. Further, most server designs do not include any air flow measuring sensor because (conventionally) these sensors are too expensive and/or too large for inclusion and use in any meaningful manner. Instead, servers have typically relied purely on temperature sensors to gauge cooling. Because of this, power efficiency and operating efficiency losses due to air flow obstructions, turbulences, and drag caused by components are not gauged and detected in real time. Additionally, because of this, feedback in the operation of a cooling unit with respect to air flow across a point within a rack unit or other electronics enclosure, pressure drop across a point within a rack unit or other electronics enclosure, and the like are essentially non-existent in conventional use.

As noted previously, the cost of power for fan use in the cooling of electronic equipment is a significant component of the cost of operating the electronic equipment. Hence optimizing or improving the efficiency of the usage of fans can readily reduce the amount of power consumed in operating an electronic equipment. Along those same lines, operating fans in a cooling unit to only spin as fast as needed, for each of the fans, to achieve a desired amount of airflow or cooling with respect to a cooled component also facilitates reduced operating costs.

As described herein, pressure sensors are getting less expensive, more compact, and more sensitive, and can therefore be a substitute to air flow sensors. Because of their small size, these pressure sensors can be used in locations where a conventional air flow sensor would not physically fit. An example pressure sensor may be a pressure sensor from TDK/InvenSense from the ICP-101xx series, which is based on micro-electro-mechanical (MEM) capacitive technology. In some embodiments, these pressure sensors used may have a noise level of 0.5 Pascals or lower. The techniques discussed here may be applied to, for example, servers, computers, laptops, or any other computing system, that uses airflow to cool down processors or other types of processing cores and/or electronic components. In described embodiments, the air flow is generated by a cooling unit comprising an array or plurality of fans/means for moving air.

This Detailed Description in divided into two sections. Section One describes underlying technology and architecture to monitor air flow in system being cooled. Section Two describes techniques for utilizing the underlying technology and architecture described in Section One in order to implement circuit board cooling.

In Section One, technology, example architecture, and techniques for measuring cooling air flow within electronic equipment are discussed. These measurements are made using air pressure sensors placed at known, fixed locations with respect to a piece of electronic equipment. In some embodiments, air pressure measurements from the air pressure sensors are obtained and then compared to stored measurements or objective measurements for an operating configuration of a cooling unit that supplies cooling air to the electronic equipment. In some embodiments, the air pressure measurements are used to set or adjust an operating configuration to achieve a prescribed cooling specification. For example, a cooling air flow across a processor can be determined from measurements obtained by air pressure sensors fore and/or aft the or adjacent to the processor in the stream of cooling air flow Likewise, pressure differences between the same fore and aft air pressure sensors can be used to determine a pressure drop across the processor. Similarly, cooling air flow and/or pressure drops can be measured in other regions within an enclosure for electronic equipment In Section Two, techniques for utilizing measurements obtained by air pressure sensors described in Section One are further discussed. These air pressure measurements are used by a processor or other computing system or controller to make decisions about which fans in a cooling unit to turn on, turn off, and what speed at which to operate. A cooling specification may describe the type of cooling needed for an item of equipment and/or portions thereof. As described, in some embodiments, air pressure measurements from the air pressure sensors are obtained and then used to set or adjust an operating configuration of a cooling unit to achieve a prescribed cooling specification. These decisions can result in different amounts power consumed by the cooling unit than the conventional technique of simply operating all fans in a cooling unit at a uniform speed. These decisions on which fans to operate and what speed(s) to operate them may advantageously maintain a desired amount of airflow on the areas which are getting heated while at the same time keeping the power consumption as low as possible and certainly lower than a conventional technique where all fans in a cooling unit are operated at a uniform speed. A method operating a cooling unit which includes a plurality of fans is described which utilized aspects of the described architecture and techniques.

Section One

Architecture

FIG. 1 illustrates an example server rack 100, in accordance with various embodiments. As depicted, server rack 100 includes one or more installed rack units 110 (110-1, 110-2, 110-3, 110-4, and 110-5 are illustrated, though a greater or lesser number may be included). Server rack 100 has a front side 103 and a rear side 104 and cooling air flows through the rack units 110 in direction 120 from the front 103 to the rear 104 of server rack 100. Rack 100 is not drawn to scale. Furthermore, although depicted as being uniform in vertical height, it should be appreciated that, within allowed standards, the vertical height of one or more of the rack units 110 may be different from that of others in a server rack 100. Arrow 120 shows the general direction of air flow from, through rack units 110, into the front 103 of rack units 110 and out the rear 104 (or upper rear) of server rack 100. Although referred to as "server rack" 100, it should be appreciated that server rack 100 is representative of any rack for mounting electronic equipment, which may include servers, other types of computers, storage devices, projectors, televisions, and/or any other type of electrical or electromechanical equipment which can be mounted in a rack or enclosure.

Without the installed rack units 110, server rack 100 would appear as a shell with a top, bottom, and sides, with front side 103 and rear side 104 framing a large through opening in the middle of server rack 100.

In some embodiments, server rack 100 further includes one or more pressure sensors 160 coupled with an external surface, such as on the front 103 of rack unit 110. When included, pressure sensor 160 operates to measure the ambient air pressure in which rack unit 110 exists and operates. Such ambient pressure measurements can be used as references for measurements by other pressure sensors (e.g., pressure sensors 360 illustrated in FIGS. 3A, 3B, 3C, and 4). Although only a single pressure sensor 160 is illustrated, additional pressure sensors 160 may be included and may be placed at other locations, such as on the sides or rear of rack 100 or at other locations that are remote from rack 100, but in the same environment (e.g., in the same room) in which rack 100 is located.

Figure 2:
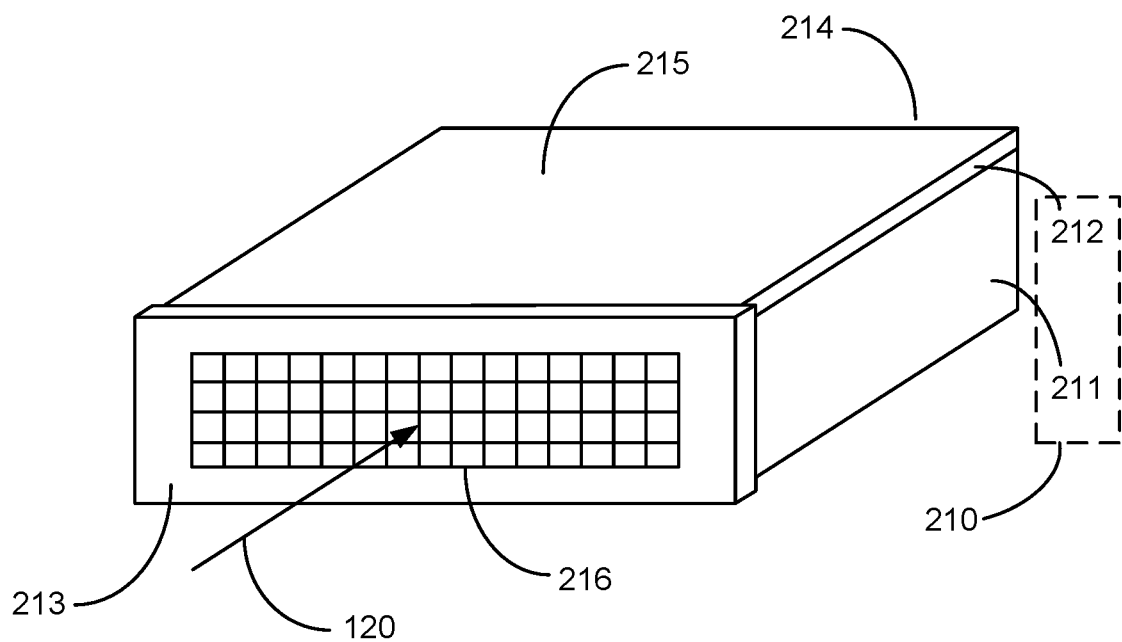
FIG. 2 illustrates an example rack unit usable with the server rack of FIG. 1, in accordance with various embodiments.

FIG. 2 illustrates an example rack unit 110 usable with the server rack 100 of FIG. 1, in accordance with various embodiments. Rack unit 110 can be used as any of the rack units 110-1 through 110-5 depicted in FIG. 1. Rack unit 110 comprises a housing 210 which houses electronic equipment. In the depicted embodiment, housing 210 has a body 211 and a cover 212 which couples to and forms a lid over the top of the body 211. Cover 212 has an external top side 215. In some embodiments, cover 212 may not be included in a rack unit 110 or other piece of electronic equipment. Rack unit 110 has a front 213 and a rear 214. A plurality of openings is configured into the front 213 of housing 210 to form an air intake 216. During operation, air flows in through air intake 216 and proceeds, generally, in direction 120 through rack unit 110 until it exits at the rear 214 of rack unit 110. When installed in a server rack 100, the air exiting the rear 214 of rack unit 110 typically exits the rear 104 (or upper rear) of the server rack 100.

Figure 3A:
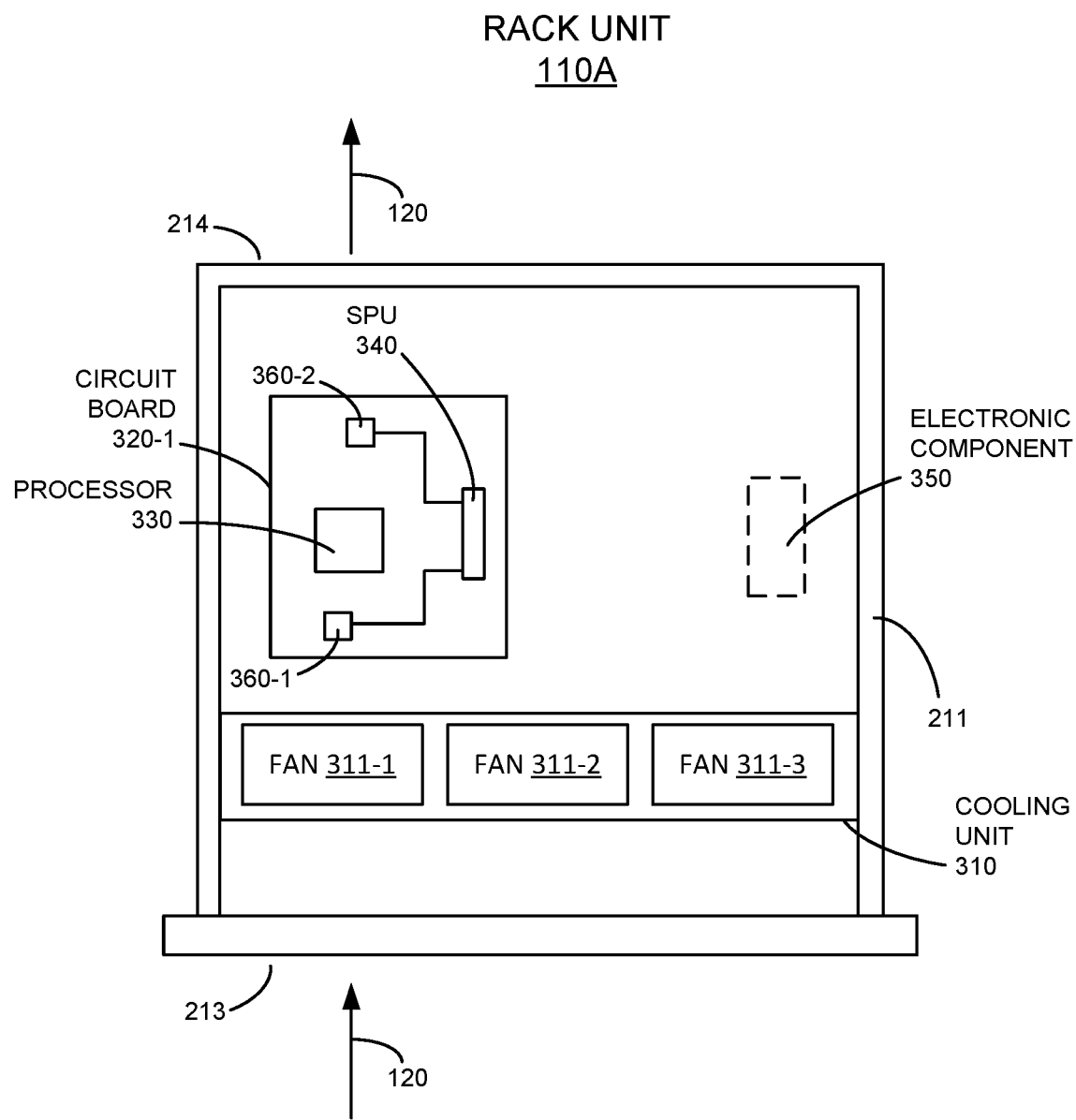
FIG. 3A illustrates a top view block diagram of the inside of the rack unit of FIG. 2, in accordance with various embodiments.

FIG. 3A illustrates a top view block diagram of the inside of a rack unit 110A which represents one configuration of rack unit 110 of FIG. 2, in accordance with various embodiments. The presented view is a top view of body 211 with cover 212 removed is removed or else not included in this embodiment. Rack unit 110 includes a cooling unit 310, a circuit board 320 (320-1 depicted), a processor 330, a sensor processing unit 340, and a plurality of pressure sensors 360. A cooling system (depicted in FIG. 6) is formed by cooling unit 310 and pressure sensors 360; the cooling system may further include sensor processor unit 340 or some other processor. In some embodiments, the cooling system may also include one or more pressure sensors 160. In some embodiments, rack unit 110 may include additional electronic component 350 and/or different configurations. Likewise, circuit board 320 may include additional components or different configurations.

Arrows 120 represent the general direction of air flow, from the front 213 to the rear 214 as it flows through rack unit 110A. It should be appreciated that, internally to rack unit 110A, air flow will deviate from direction 120 as it moves in, through, and around structures internal to rack unit 110A on its general flow from front 213 to rear 214 of rack unit 110A.

Cooling unit 310 is coupled with housing 210 and includes one or more fans 311. Three fans 311 (311-1, 311-2, and 311-3) are depicted, but a greater or lesser number of fans 311 may be included in other embodiments. Though not depicted, a cooling unit 310 may include a controller which controls the fans to operate according to a supplied/specified operating configuration. Fans 311 generates cooling air by pulling air through the front 213 of housing 210 and moving it out through the rear 214. As the air flow moves between front 213 and rear 214 it passes in, through, and/or around circuit board 320-1, processor 330, and/or electronic component 350. The flowing air absorbs and removes radiated heat and expels it out the rear 214 of rack unit 110, thus cooling the internal components (i.e., circuit board 320-1, processor 330, electronic component 350). Cooling unit 310 is configured, such as via its controller, to operate according to one or more operating configurations, and at any given time during operation is set to operate at one of its operating configurations.

An "operating configuration" of cooling unit 310 is a description/instruction for which fan(s) 311 in a cooling unit 310 should be operated and at what speed(s) they should be set to operate. In a cooling unit 310, variances between operating configurations include variations in which fans 311 in a cooling unit 310 are turned on and what speeds they are to be operated. These variations result in different amounts of power consumed by the cooling unit 310 in different operating configurations. For example, in a first operating configuration, fan 311-1 may be operated at 50 percent of its full speed while fan 311-2 is turned off (not operating) and fan 311-3 is turned off (not operating). In second operating configuration, fan 311-1 may be operated at full speed while fan 311-2 is operated at 50 percent of its full speed and fan 311-3 is operated at 50 percent of its full speed. In a third operating configuration, fans 311-1, 311-2, and 311-3 may all be operated at full speed. It should be appreciated that these are merely examples of operating configurations and that many other operating configurations are possible and anticipated.

Circuit board 320-1 is disposed within and coupled with housing 210 and provides a substrate on which one or more electronic components such as one or more processors 330 are disposed. In some embodiments, such as the depicted embodiment, a sensor processing unit 340 and/or one or more pressure sensors 360 may also be disposed upon circuit board 320-1. In some embodiments, all or a portion of a sensor processing unit 340 may be implemented as a portion of a larger processor 330 disposed on a circuit board.

Processor 330 can be one or more microprocessors, central processing units (CPUs), DSPs, general purpose microprocessors, processing cores, Application Specific Integrated Controllers (ASICs), Application Specific Instruction Set Processors (ASIPs), Field programmable gate arrays (FPGAs) or other processors which run software programs or applications. During operation processor 330 creates heat which is removed by cooling air that flows around processor 330 and/or its heatsink(s). The flow of cooling air is supplied by cooling unit 310.

Sensor processing unit (SPU) 340 is disposed within housing 210. SPU 340 is a specialized processor which uses less power than processor 330 and is configured to interface with and/or operate one or more sensors which sense environmental characteristics such as air pressure, temperature, direction, and the like. SPU 340 may be integrated into a single package such as an integrated circuit or small circuit board, which includes a processor, a memory, and in some instances one or more sensors.

A pressure sensor 360 (and also pressure sensor 160 of FIG. 1) operates to sense air pressure at its respective location and provide an electronic output which is calibrated to represent the sensed air pressure. Such pressure sensors are small and utilize very little power to operate. In some embodiments, such pressure sensors are micro-electro-mechanical system (MEMS) devices. For example, TDK/InvenSense pressure sensors from the ICP-101xx series, which is based on MEM capacitive technology, may be used as pressure sensor 160 and pressure sensors 360. In some embodiments, one or more pressure sensors 360 may be located within housing 210. In some embodiments, one or more pressure sensors 360 may be disposed on circuit board 320 and coupled, via conductive traces on the circuit board 320, to an SPU 340 (which may also be disposed on the circuit board). In some embodiments, each pressure sensor 160, 360 at a different location may be part of its own sensor processing unit 340, and each of these sensor processing units 340 may communicate with one another and/or with a controller for a cooling unit 310. In some embodiments, a pressure sensor 160 and/or 360 may also be configured to measure temperature as well as air pressure.

As depicted, pressure sensor 360-1 is disposed such that it is located between processor 330 and cooling unit 310. Pressure sensor 360-1 measures air pressure data at the position in which it is located. Pressure sensor 360-2 is disposed such that processor 330 is between the location of pressure sensor 360-2 and cooling unit 310. Pressure sensor 360-2 measures air pressure data at the position in which it is located. Based on their locations fore and aft of processor 330 in the flow of air from cooling unit 310, an air pressure measurement obtained from pressure sensor 360-2 can be subtracted from an air pressure measurement obtained from pressure sensor 360-1 to determine a pressure drop across processor 330 and the portion of circuit board 320 located between pressure sensors 360-1 and 360-2. In various embodiments, nominal pressure drops can be determined and stored for each operating configuration of cooling unit 310. Although not depicted as being directly in line with one another (in direction 120) in some embodiments, pressure sensors 360-1 and 360-2 may be so aligned. It should be appreciated that FIG. 3A (as well as FIGS. 3B, 3C, and 4) illustrate two-dimensional views, and that the depicted pressure sensors can be placed in three-dimensions. For example, pressure sensors 360 illustrated in FIG. 3A can be integrated into circuit board 320, mounted on circuit board 320 but not electrically integrated with other components on the circuit board, and/or mounted above circuit board 320.

Electronic component 350, when included, may comprise other electrical equipment such as a power supply, power conditioner, memory, disk drive, input/output circuitry, or the like, which operates in conjunction with processor 330 and which is disposed within housing 210. Electronic component 350 is also cooled by air flow which passes through housing 210.

Figure 3B:
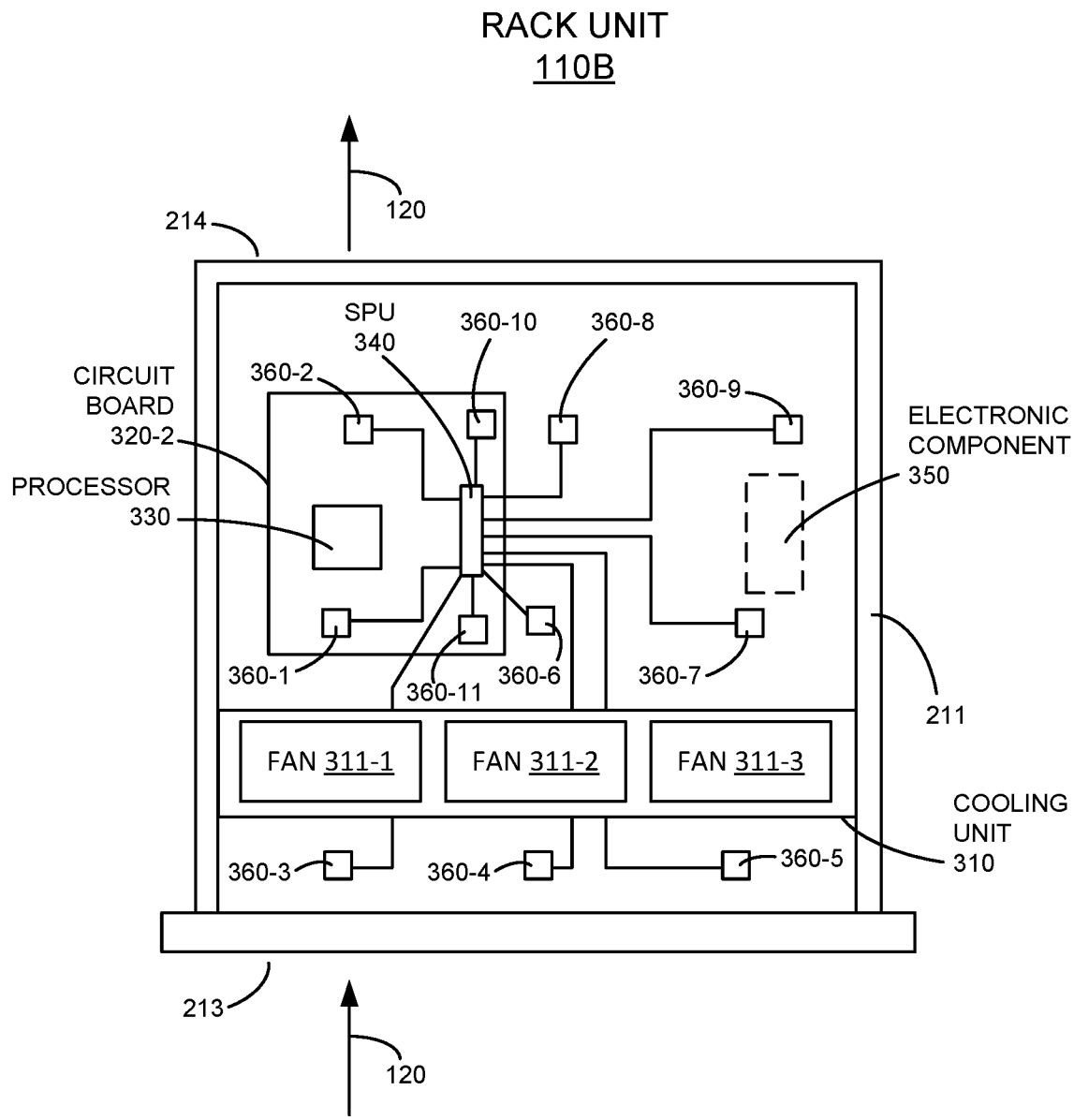
FIG. 3B illustrates a top view block diagram of the inside of the rack unit of FIG. 2, in accordance with various embodiments.

FIG. 3B illustrates a top view block diagram of the inside of a rack unit 110B which represents one configuration of rack unit 110 of FIG. 2, in accordance with various embodiments. The presented view is a top view of body 211 with cover 212 removed or else not included in this embodiment. A cooling system is formed by cooling unit 310 and sensors 360; the cooling system may further include sensor processor unit 340 or some other processor. FIG. 3B differs from FIG. 3A by including additional pressure sensors 360 (360-3 to 360-11) which form a larger two-dimensional arrangement of pressure sensors that can be used to measure air pressures in a plurality of other locations within housing 210 (e.g., to monitor cooling and air flow with respect to electronic component 350). The depicted two-dimensional layout or arrangement of pressure sensors 360-1 to 360-2 is an irregular pattern, in other embodiments the pattern may be a regular arrangement or array with uniform spacing between pressure sensors 360 and uniform alignment of pressures sensors 360.

Figure 3C:
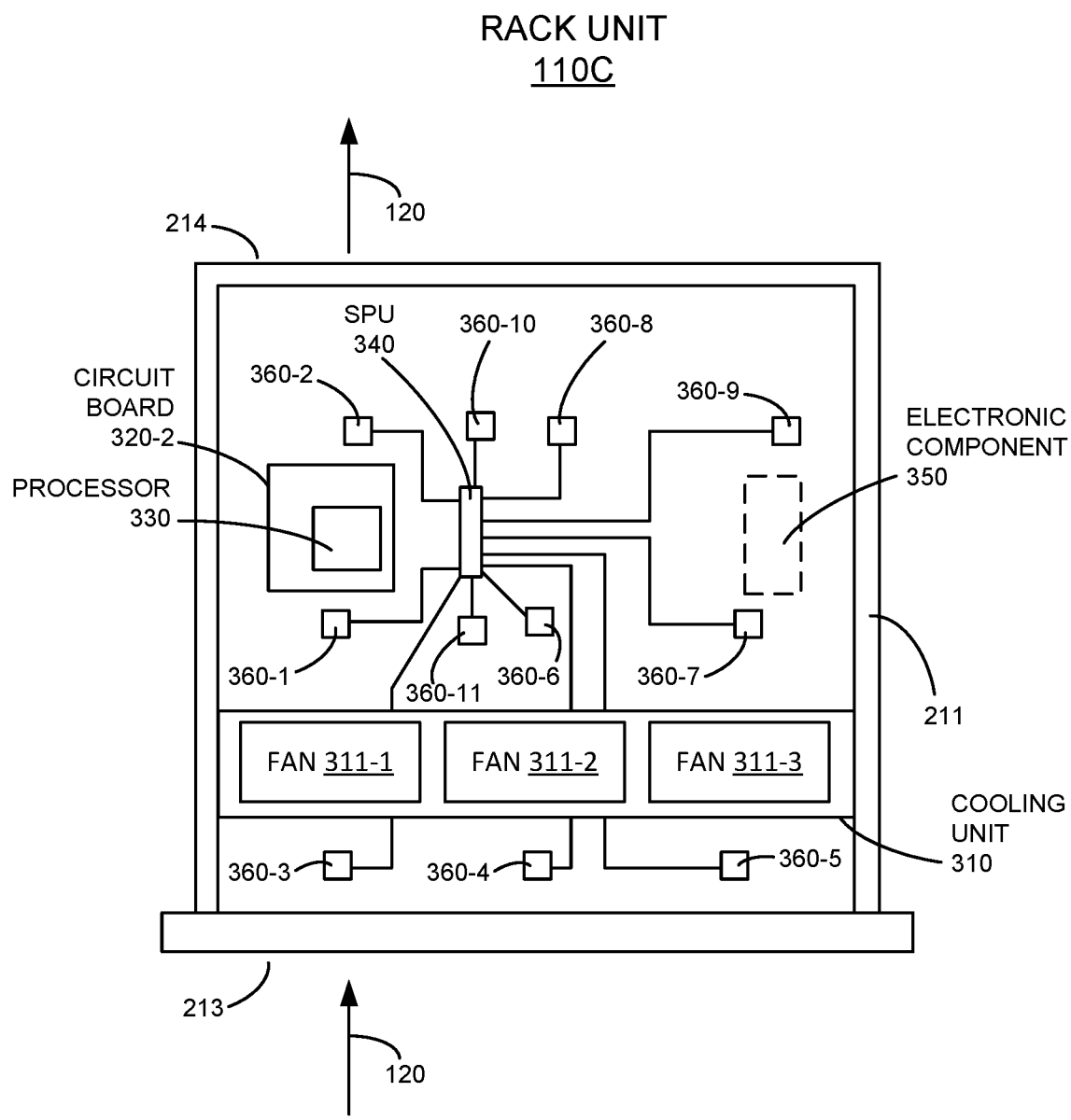
FIG. 3C illustrates a top view block diagram of the inside of the rack unit of FIG. 2, in accordance with various embodiments.

FIG. 3C illustrates a top view block diagram of the inside of a rack unit 110C which represents one configuration of rack unit 110 of FIG. 2, in accordance with various embodiments. The presented view is a top view of body 211 with cover 212 removed or else not included in this embodiment. A cooling system is formed by cooling unit 310 and sensors 360; the cooling system may further include sensor processor unit 340 or some other processor. FIG. 3C is similar to FIG. 3B except that neither sensor processing unit 340 nor any pressure sensors 360 are disposed as components of circuit board 320-2. It should be appreciated that in other embodiments, a circuit board 320 may have one or more pressure sensors 360 as components but not have an SPU 340 disposed as a component of the circuit board, or conversely may include an SPU 340 as a component but not have any pressure sensors disposed as components of the circuit board. In other embodiments, one or more pressure sensors 360 and/or an SPU 340 may be positioned on, above, or below a circuit board 320 without being integrated as components that are electrically coupled to the circuit board 320.

With reference to FIGS. 3A-3C, it should be appreciated that the layout, size, positioning, and number of components and circuit boards depicted are intended as non-limiting examples. That is, a rack unit 110 or other item of electronic equipment (e.g., a computer, projector, display, amplifier block, etc.) may include many different components, components of different sizes than shown, and components at locations that are different from the depictions. Likewise, a circuit board (whether in a rack unit or in another piece of electrical equipment being monitored for air flow disturbances may include many different components than those depicted, components of different sizes than shown, and components at locations that are different from the depictions.

Figure 4:
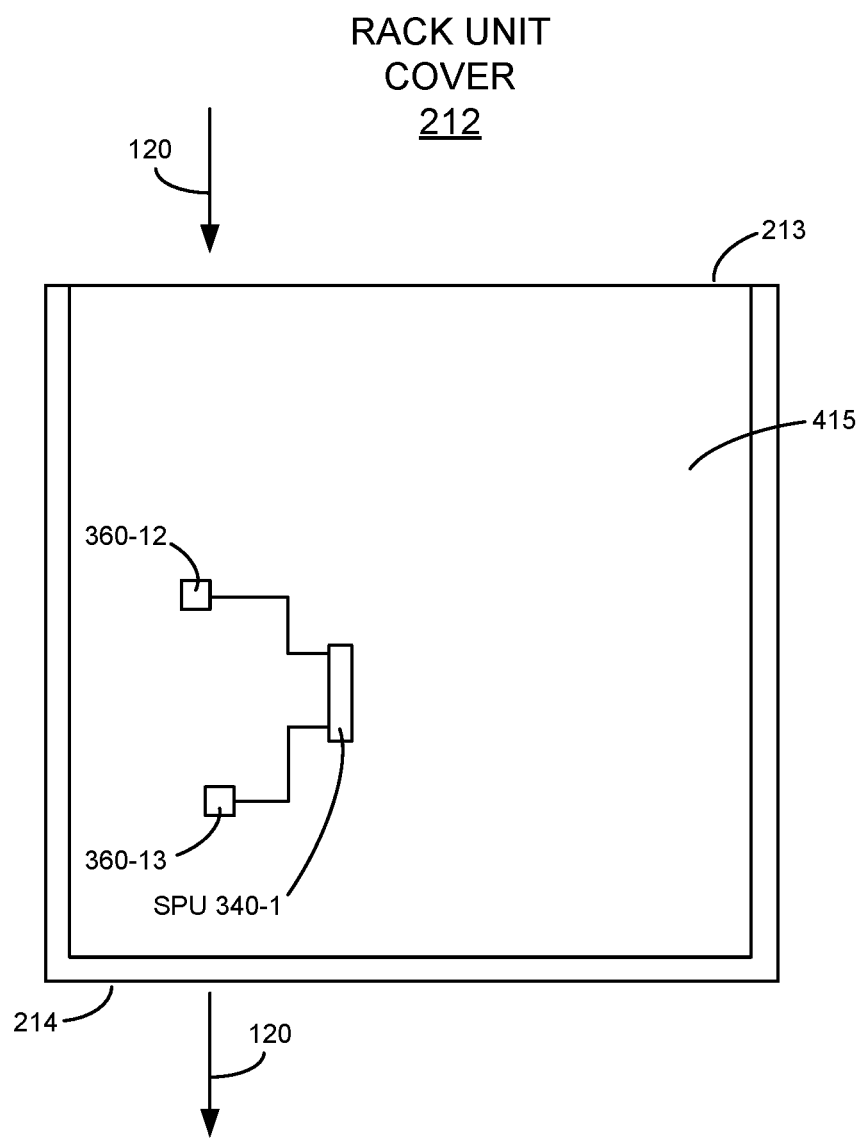
FIG. 4 illustrates a bottom view block diagram of components disposed upon the upper interior service of a rack unit cover for the rack unit of FIG. 2, in accordance with various embodiments.

FIG. 4 illustrates a bottom view block diagram of components disposed upon the upper interior surface 415 of a cover 212 for the housing 210 of rack unit 110 of FIG. 2, in accordance with various embodiments. In some embodiments, pressure sensors 360 (e.g., 360-12, 360-13, and the like) may be disposed upon upper interior surface 415. These pressure sensors 360 are coupled with a sensor processing unit 340, which may be the sensor processing unit 340 of FIG. 3A, FIG. 3B, or FIG. 3C or a separate sensor processing unit 340-1 disposed upon upper interior surface 415 or elsewhere. In some embodiments, pressure sensors 360 may only be disposed upon the upper interior surface 415 of cover 212 with none being disposed elsewhere within housing 210. In other embodiments, pressure sensors 360 may only be disposed within body 211 of housing 210 with no pressure sensors disposed upon the upper interior surface 415 of cover 212. In some embodiments, pressure sensors 360 may be disposed upon both the upper interior surface 415 of cover 212 and elsewhere within housing 210.

As depicted, pressure sensor 360-12 is disposed such that it is located between processor 330 and cooling unit 310 (when cover 212 is installed atop body 211 of housing 210). Pressure sensor 360-12 measures air pressure data at the position in which it is located. Pressure sensor 360-13 is disposed such that processor 330 is between the location of pressure sensor 360-13 and cooling unit 310 (when cover 212 is installed atop body 211 of housing 210). Pressure sensor 360-13 measures air pressure data at the position in which it is located. Based on their locations fore and aft of processor 330 in the flow of air from cooling unit 310, an air pressure measurement obtained from pressure sensor 360-13 can be subtracted from an air pressure measurement obtained from pressure sensor 360-12 to determine a pressure change across processor 330 and the portion of circuit board 320 located between pressure sensors 360-12 and 360-13. In various embodiments, nominal pressure changes can be determined and stored as reference for each operating configuration of cooling unit 310. Although not depicted as being directly in line with one another (in direction 120), in some embodiments, pressure sensors 360-12 and 360-13 may be so aligned.

Figure 5:
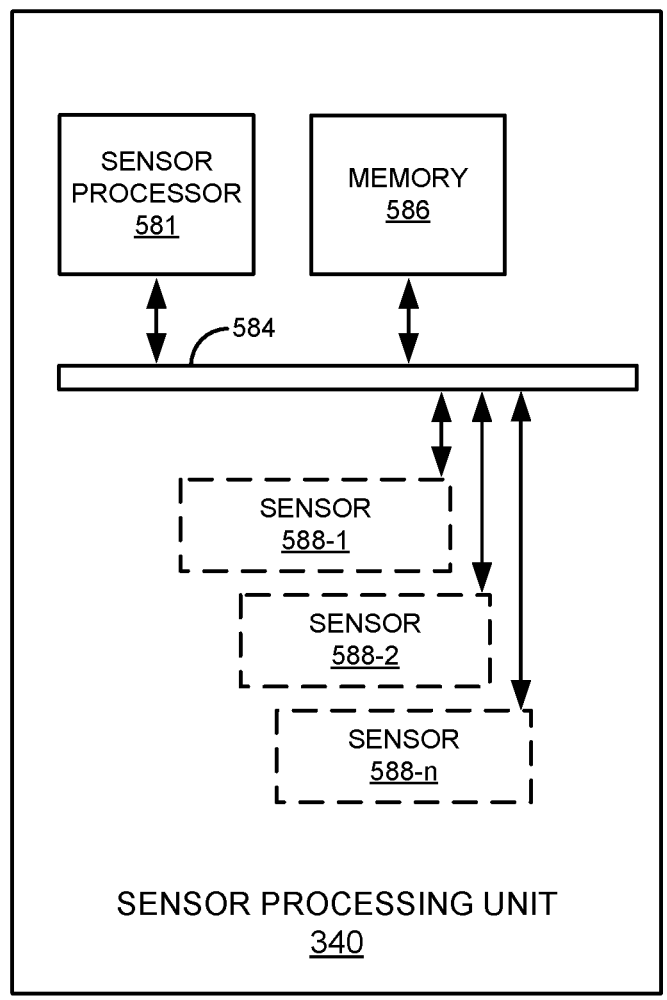
FIG. 5 illustrates a block diagram of an example sensor processing unit, in accordance with various embodiments.

FIG. 5 illustrates a block diagram of an example sensor processing unit (SPU) 340, in accordance with various embodiments. SPU 340 is an integrated sensor assembly which includes a sensor processor 581, a memory, and a bus 584. In some embodiments, SPU 340 also integrates at least one or more sensors 588 (588-1, 588-2, . . . 588-n) in its package. Bus 584 facilitates communication between these and other components of sensor processing unit 340 and may provide a communication path for other sensors (e.g., air pressure sensors 160, 360) which are coupled with and operated by sensor processing unit 340 but are not within the integrated package of SPU 340. In some embodiments, some or all the components illustrated in sensor processing unit 340 may be embodied in a single package or even on a single integrated circuit. For example, the sensor processor 581, bus 584, memory 586, and at least one sensor 588 (which may be a pressure sensor, temperature sensor, motion sensor) may be integrated with one another into a single package or even in a single integrated circuit. It should be appreciated that sensor processing unit 340 may be manufactured as a stand-alone unit (e.g., an integrated circuit) that may exist separately from a larger electronic device or circuit board. In other embodiments, SPU 340 may be manufactured such that it is disposed upon a larger circuit board (e.g., circuit board 320) which includes other components such as a processor 330 which may be a host processor in the environment where SPU 340 is operated.

Sensor processor 581 can be one or more microprocessors, CPUs, DSPs, general purpose microprocessors, ASICs, ASIPs, FPGAs or other processors which run software programs, which may be stored in memory 586, associated with the functions of sensor processing unit 340. In some embodiments, sensor processor 581 and/or SPU 340 may communicate with a cooling unit 310 to set and/or adjust the operating configuration of the cooling unit. This may include sensor processor 581 communicating with a controller of the cooling unit 310 or with any control mechanism for cooling unit 310. In some embodiments, the communications may be carried out by a communications module or routine (not shown) under the direction of sensor processor 581. In some embodiments, sensor processor 581 carries out or directs communications with and/or messages or reports to an external entity (which may be a human or a machine) such as a controller, supervisor, or manager of systems.

Bus 584 may be any suitable bus or interface to include, without limitation, a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. In the embodiment shown, sensor processor 581, memory 586, sensor(s) 588 (if any), and other components of sensor processing unit 340 may be communicatively coupled through bus 584 in order to exchange data. Bus 584 may be connected to an external bus, such as a bus on the circuit board being monitored, or directly to the overall host controller for a system. In some instances, some or all communication between components may also be wireless, reducing or eliminating the need for bus 584 and/or external connections to other busses.

Memory 586 can be any suitable type of memory, including but not limited to electronic memory (e.g., read only memory (ROM), random access memory, or other electronic memory). Memory 586 may store algorithms or routines or other instructions for processing data received from one or more sensors 588, 160 and/or 360, as well as the received data either in its raw form or after some processing. Such algorithms and routines may be implemented by sensor processor 581 and/or by logic or processing capabilities included in sensor 588.

Sensor processing unit 340 may include at least one sensor 588 but may include two or more sensors 588 of the same or different types. A sensor 588 may comprise, without limitation: a temperature sensor, an atmospheric pressure sensor, an infrared sensor, an ultrasonic sensor, a radio frequency sensor, a navigation satellite system sensor (such as a global positioning system receiver), an acoustic sensor (e.g., a microphone), an image sensor, an inertial or motion sensor (e.g., a gyroscope, accelerometer, or magnetometer) for measuring the orientation or motion of the sensor in space, or other type of sensor for measuring other physical or environmental quantities. In one example, sensor 588-1 may comprise a temperature sensor, sensor 588-2 may comprise a pressure sensor, and sensor 588-*n* may comprise an acoustic sensor. The acoustic sensor may be used to gauge sound levels associated with various operating configurations of cooling unit 310 during nominal operation, so that differences can be noted (such as if a fan 311 is malfunctioning). In other embodiments, a motions sensor may be included as one of the sensors 588, to provide indications that a server, rack unit, or piece of monitored electronic equipment has been moved. Movement may occur during installation, removal, reinstallation, modification, or the like—all instances where an disturbance to air flow may be introduced into a piece of electronic equipment. It should be appreciated that other types of sensors may be utilized in various other combinations.

In some embodiments, one or more sensors 588 may be implemented using a micro-electro-mechanical system (MEMS) that is integrated with sensor processor 581 and one or more other components of SPU 340 in a single chip or package.

Although depicted as being included within sensor processing unit 340, one, some, or all sensors 588 may be disposed externally to sensor processing unit 340 in various embodiments. In such a case, the sensor(s) 588 may be referred to as external sensors and may be connected to bus 584 to communicate with sensor processor 581 and/or sensor processing unit 340.

Example Techniques for Operation of Architecture

To measure the air flow over the processor(s) and/or other electronic components that need cooling, an item of electronic equipment, such as a server, needs to be configured with one or more pressure sensors. The amount of pressure sensors depends on the analysis that is desired/required, and the spatial resolution desired/required. FIG. 3A-3C show example architectures, where pressure sensors 360 are mounted inside the housing 210 of a rack unit 110 which, in some embodiments. The pressure sensors may be mounted strategically in/around various components of the server. In some embodiments, one or more pressure sensors 160, may be mounted outside of the housing 210 to measure ambient pressure and to be used as a reference pressure(s) in differential pressure determinations. Some or all these pressure sensors 160 and 360 may be capable of measuring air pressure as well as measuring temperature as well as pressure. Although not depicted, in embodiments where pressure sensors do not also measure temperature, temperature sensors may also be co-located with one or more pressure sensors.

FIGS. 3B and 3C show pressure sensors 360 placed before (pressure sensors 360-3, 360-4, and 360-5) and after (pressure sensors 360-1, 360-2, 360-6, 360-7, 360-8, 360-9, 360-10, and 360-11) the fans 311. Air pressures measured by these pressure sensors may be compared to the ambient reference pressure (measured by a pressure sensor 160). These pressure sensors fore and aft the fans 311 may be used to determine the efficiency of the fans in general or of one or more particular operating configurations of the fans 311 in cooling unit 310. The efficiency of the fans in terms of measured pressure fore and aft and/or pressure differentials between fore and aft pressure sensors may also be compared to one or more of: power consumption of the fan(s) 311 in one or more operating configurations of cooling unit 310; temperature(s) measured within housing 210; and operating load of the processing core(s) of processor 330.

FIGS. 3A, 3B, 3C, and 4 also depict embodiments where pressure sensors 360 (360-1 and 360-2) are located on fore and aft sides of processor 330 (in the general air flow direction 120) to determine the air flow via air pressure and/or changes in air pressure. The pressure sensor may be mounted only on the fore and aft sides reflecting the direction 120 of main air flow, or on all four sides. Other areas on circuit board 320 or in other location of housing 210 may be occupied by memory or other electronic components. Pressure sensors 360 may be placed in proximity to these other areas to measure and/or assist in regulating the air flow in those areas. For example, with respect to these other areas (which may not need as much cooling as processor 330) measurements of air pressure may be made to make sure not too much air flow is generated there since it may not be needed as it would thus be a waste of power and cost to overcool these other areas. One or more pressure sensors 360 (360-2, 360-8, 360-9, and 360-10) may also be place near the rear 214 to determine the general air flow. Any sensor combination may be used to determine airflow, via differential pressure, between those pressure sensors 360. The pressure sensors 360 may be placed in a two-dimensional arrangement which may be a uniform array or a non-uniform arrangement. In the two-dimensional arrangement, the spacing between the pressure sensors 360 may be related to the areas where it is desired to measure pressure and/or the resolution of the required measurement information. The spacing is directly related to the overall costs of the pressure sensors 360 as tighter spacing requires more pressure sensors 360, and a trade may be struck in some embodiments to balance or optimize the costs of the pressure sensors 360 and the savings gained in reduced power costs realized by only providing cooling air flow which needed as evidenced by measurements from the pressure sensors 360. The pressure sensors 360 may also be place before and after of the areas of interest (e.g., processor(s), circuit boards, memory, disk drives, etc.) in the main direction 120 of the air flow through housing 210. The pressure sensors 360 may be mounted on the main circuit board (e.g., circuit board 320) on which the processor 330 and memory are also placed, or the pressure sensors 360 may be mounted independently (e.g., in the cover 212 or body 211 of the housing 210 in which the circuit board is disposed). The processing of pressure data may be performed by the main processor 330 (that needs to be cooled), or a dedicated (sensor) processor (e.g., sensor processor 581) which is associated with one or more of the pressure sensors 360 may be used.

The pressure measurements obtained from pressure sensors 360 in FIGS. 3A, 3B, 3C, and 4 give a distribution of volume of air flowing in different areas of the housing 210 of a rack unit 110 for a given operating configuration cooling unit 310. Conventionally, operating configurations are chosen which increase the speed of fans as load on processor 330 increases so that air flow increases (with increasing load) around the area where processor 330 is positioned. In situations, where all fans in cooling unit 310 are operated at the same speed, air flow also increases in other areas far away from processor 330 (such as near pressure sensor 360-7 and 360-9 which, because far from processor 330 are not likely to need more cooling simply due to an increase in the load on processor 330. Hence, blowing air (or more air) in these areas can be a waste of power. Because of this, in some embodiments of a rack unit 110 there are be better configurations than running all fans in a cooling unit 310 at the same speed when concentrated and/or increased air flow in the region of the processor 330 may be all that is required for adequate cooling of all electronic components within the rack unit 110. Techniques for achieving these "better configurations" will are discussed further in Section Two.

In some embodiments, empirically determined pressure difference measurements between various pressure sensors 360 disposed in a rack unit 110 are used to estimate operating configurations fans within a cooling unit 310 that allow the right amount of air flow at the processor area but minimum or reduce waste air flow in areas where cooling is not required and/or where less cooling is required. These configurations may vary based upon load on the processor 330, but in general result in lower power consumption versus simply operating all fans at 100 percent speed or versus operating all fans at the same speed. This is because, in these configurations, some of the fans are may not be operated at the same speed or at all. Generally, it has been observed from measuring pressure differentials in the manner described that fans farther away from processor 330 (e.g., fan 311-3) even when operated at lower speed than ones near (e.g., fans 311-1 and 311-2) do not affect the cooling at the processor. Hence this allows an increased level of optimization of power consumption by operating fans closer to processor 330 at a first speed and operating fans 311 farther away from the processor 330 at a lower speed than this first speed (or not at all).

Air Flow Fundamentals

As processor load increases, heating increases on the processing units (e.g., processor 330). Hence the amount of energy (Q) to be dissipated increases. From a cooling perspective this means more air flow is required over the processing units to achieve cooling.

The relationship that determines the required volume of air needed to cool a processing unit can be given by Equation 1.

$$G = Q \div (\rho C_P \times T) \quad \text{Equation 1}$$

In Equation 1, G is the volume of air, T is temp difference between ambient air and processing unit and ρ represents the density of air (which is typically used as a constant in such equations but can be varied based on altitude).

The relationship of volume of air and fan speed is given by Equation 2, wherein N is the speed of the fan and D is the diameter of the fan.

$$G = K_q N D^3 \quad \text{Equation 2}$$

The volume of air flowing creates a pressure difference giving by Equation 3.

$$P = K_P \rho N^2 D^2 \quad \text{Equation 3}$$

This pressure difference can be measured by subtracting ambient pressure from the pressure measured at a given point. If this difference is positive, it means more air is coming at that location. If the pressure difference is negative, it means more air is going away from that point. It follows then that the pressure will be negative at the intake of fans and positive at the exhaust. Differential pressure measurement is one part of determining air flow and means, typically, that a pressure measurement system as described herein comprises at least two pressure sensors, and air flow is determined based on their pressure difference. Changes in air flow can be noted when the pressure difference changes. However, with a single pressure sensor, an obtained pressure measurement may be compared to a stored pressure measurement value for that pressure sensor to achieve a similar result for a single location. Likewise, pressure differences between pressure sensors may be compared to stored values. The stored values may be considered normal operating values and variance beyond some threshold amount from such stored values is indicative of some sort of disturbance to air flow. The stored values may be predetermined and preset (such as at a factory), empirically determined such as an averaged value over time or a value acquired during normal operation, or some combination. When pressure is discussed herein, it may refer to an absolute pressure at that point, relative pressure compared to a stored value, or a differential pressure between two pressure sensors.

Figure 6:
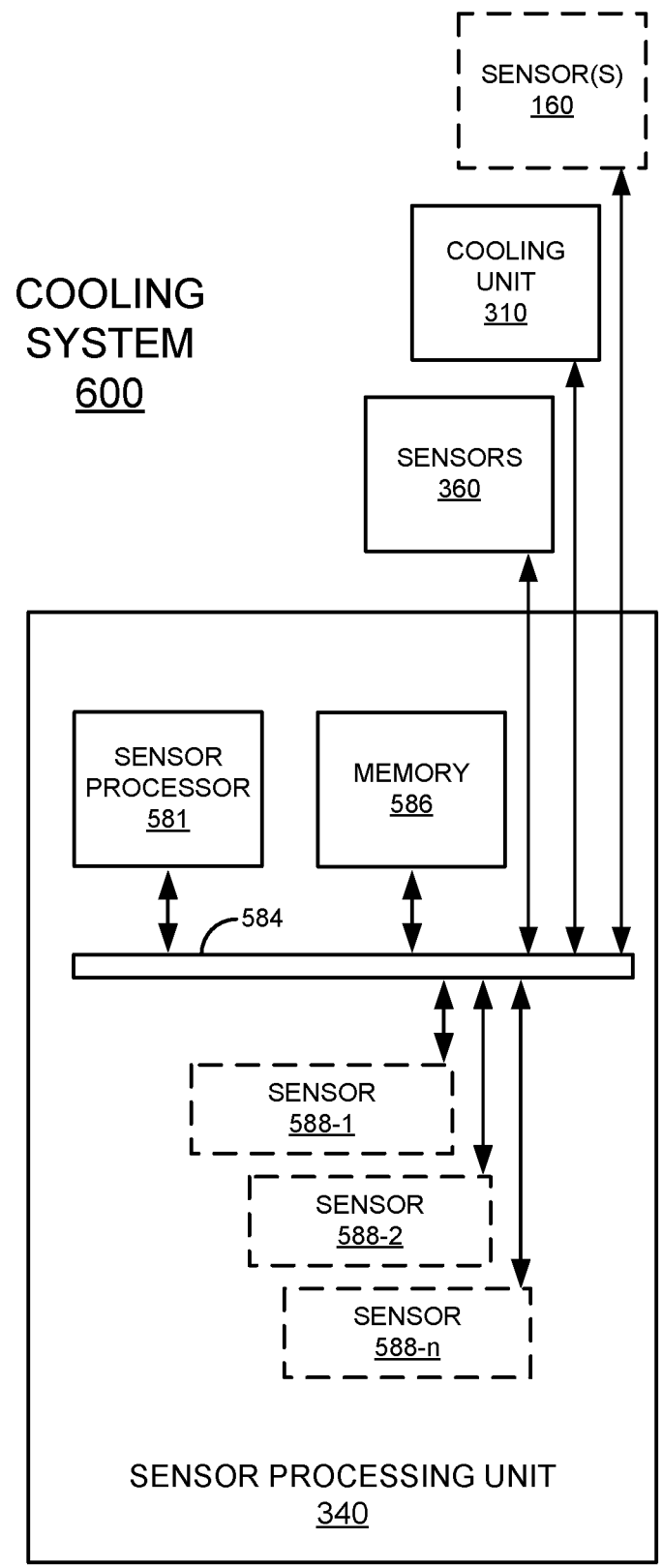
FIG. 6 illustrates an example cooling system, in accordance with various embodiments.

FIG. 6 illustrates an example cooling system 600, in accordance with various embodiments. Cooling system 600 may also be referred to as a "circuit board cooling system." Cooling system 600 includes a cooling unit 310 comprising a plurality of fans which generate air flow to cool a portion of a circuit board, a plurality of air pressure sensors 360 configured to measure air pressure data at their respective locations in a cooled space, and a processing means. In some embodiments cooling system 600 may additionally include one or more pressure sensors 160 which measure an ambient air pressure of an environment in which the cooled space is disposed. The processing means may be a processor on the circuit board being cooled, in the enclosure or rack where the cooling unit is disposed, in the cooling unit, in a sensor processing unit 340 which is coupled with the pressure sensors 360, and/or elsewhere. In some embodiments, cooling system 600 further includes all or a portion of the enclosure in which the cooling system operates (e.g., rack unit 110 (or a portion thereof such as cover 212)). Cooling unit 310, of cooling system 600, functions in accordance with an operating configuration. Though not labeled independently as a "cooling system" in FIGS. 3A-3C, the components of cooling system 600 are present and functioning in these embodiments.

Section Two

Calibration and Fine Tuning

To determine the optimum operating configuration for the required cooling specification, a calibration step may be needed. The calibration may be a two-step process, where first a coarse level calibration is performed, which is then followed by one or more fine tuning steps. For example, the calibration may be performed to determine the relation between the operating configuration and the resulting pressure distribution from which the air flow distribution can be deduced. Once the relation between the operating configuration and the air flow/cooling efficiency has been determined during calibration, the optimum operating configuration may be selected based on the desired operation of the system. For the following discussion of fine tuning and calibration of a cooling unit and the cooling system in which it operates, several definitions are used, and reference is made to cooling unit 310 of FIG. 3B and a cooling system in which it operates. Depending on the configuration of speeds of fans, a unique air flow is created. With reference to FIG. 3B mapping can be represented as: [f1, f2, f3]→[p1, p2, p3, p4, . . . , p11]. Here fi is the speed of fan i and pi is the pressure at the location of pressure sensor i. The pressure may be the absolute pressure as measured by the pressure sensor, or the pressure may be corrected for the ambient pressure. For example, the ambient pressure may be subtracted from the measured pressure values to generate a pressure difference with the ambient pressure (the pressure difference is between the particular sensor p and an ambient pressure sensor such as pressure sensor 160 of FIG. 1). In this example three fans speeds, f1 through f3 (corresponding to respective speeds of fans 311-1 through 311-3), are used, but any number of fans may be used applying a similar strategy. Similarly, in this example, eleven pressures p1 through p11 (corresponding to pressures measured at the respective locations of pressure sensors 360-1 through 360-11) are used, but any number of pressure sensors may be used. As a short representation, the fan speeds and pressure differences can be expressed as vectors such that F and P respectively and relationship F→P. An aspect of cooling in general and validating that a cooling specification is met/complied involves ensuring that a desired amount air is flowing in the regions around processing unit/core, portion/region of a circuit board or electronic equipment, or any other region(s) of interest. For example, for the processor unit/core (i.e., processor 330) in this example, the air flow or cooling effect is a function of the pressure difference over the processor unit caused by the air flow, which therefore depends on the pressure difference over the processor. In this example, the pressure difference will be between p1 (corresponding to pressure measured by pressure sensor 360-1) and p2 (corresponding to pressure measured by pressure sensor 360-2). In brief note, this can be written as shown in Equation 4.

$$P\text{core}=[p1,p2] \qquad \text{Equation 4}$$

The relation F→P may also be used to map the different operating configuration, i.e., different fan speeds, to the pressure differences of the regions of interest. In this case, the vector P contains the pressure difference over the different regions of interest, such as e.g., processor 330, SPU 340, and/or electronic component 350. Power consumed by a configuration F is given by Equation 5, which is a sum of the power consumed by each fan in cooling unit 310.

$$\text{Power}(F)=\Sigma\text{Power}(fi) \qquad \text{Equation 5}$$

Out of all possible configurations of F there is a sub set of configurations that a server/cooling unit uses where all fan speeds are same as one another. This can be represented as show in Equation 6.

$$F\text{server}=F \text{ if } f1=f2=f3=f4 \qquad \text{Equation 6}$$

Figure 11:
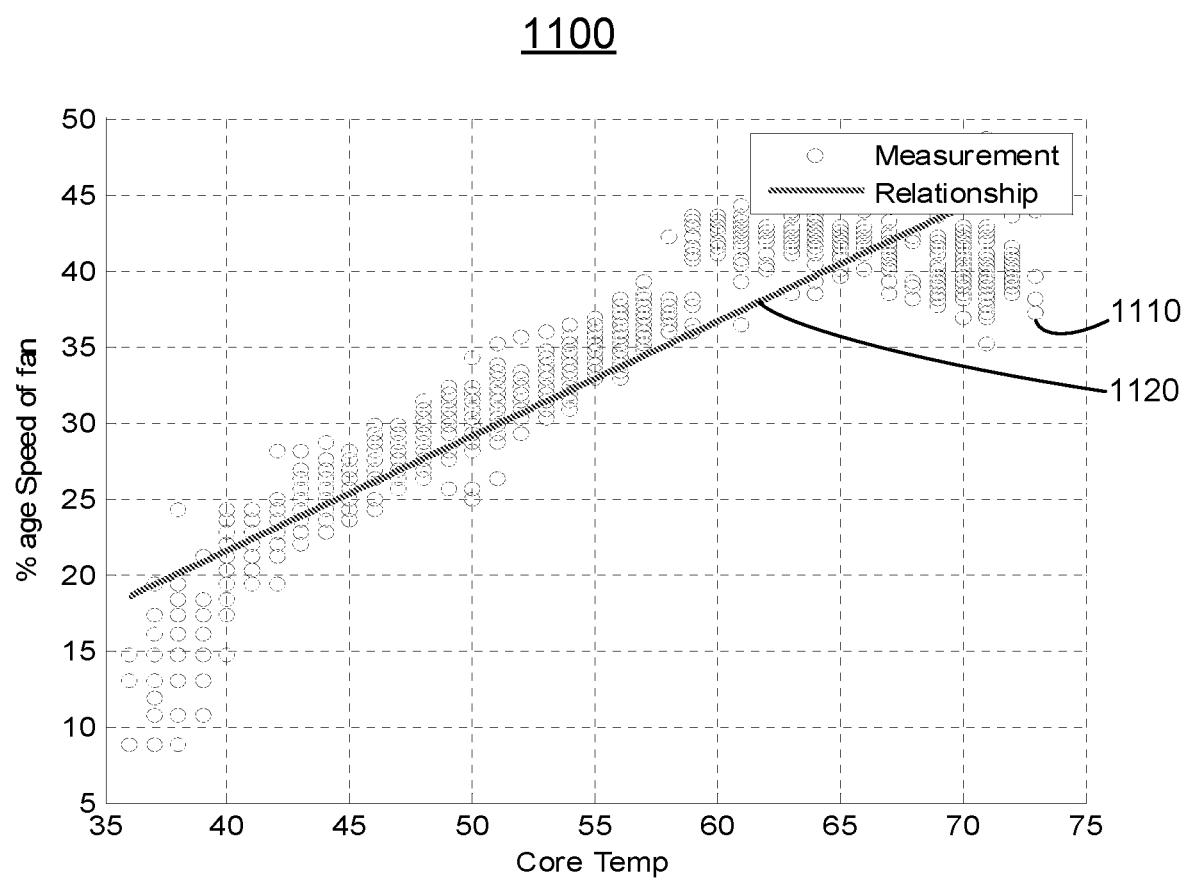
FIG. 11 illustrates a diagram of the relationship between core temperature of a processor core with uniform fan speed of a set of fans in a cooling unit.

As illustrated in FIG. 11, there is a generally approximate linear relationship between core temperature and fan speed with all fans operated at the same speed. This relationship can be expressed as shown in Equation 7, where s is speed of a fan, k and c are constants and T is the core temperature.

$$s=kT+c \qquad \text{Equation 7}$$

Conventional server unit that runs all fans at the same speed, often lack the ability to control the fans individually and also lack the capability of optimizing the operating configuration. The addition of the pressure sensor therefore gives new possibilities for further optimization of the fans to provide optimum cooling at the lowest possible power usage/costs.

Calibration

Since it is may be difficult to establish the relationship F→P by using aerodynamic fundamentals, a method of creating an empirical relationship has been developed. An example embodiment is represented by flow diagram 700 of FIG. 7. In the calibration procedure, the cooling system 600 runs a calibration routine varying the fan speeds in cooling unit 310. In this routine, cooling system 600 runs different permutations of speeds of fans and measures pressure differences and pressure distribution created over the plurality of pressure sensors. Each of these permutations can be considered an "operating configuration" for cooling unit 310. Permutations can be done, for example, in fan speed increments of e.g., 5% ranging from 0% to 100% of fan speed for each fan. Other increments and/or ranges may be used. This gives, for each measured operating configuration, an air flow estimation. The airflow estimation may be performed for the complete area being cooled (e.g., an enclosure such as rack unit 110), or may only be performed for one or more areas of interest, such as e.g., processor 330, electronic component 350, etc. The obtained data may be stored in a look up table (or other structure) of operating configuration F and airflow P. The look up table may be stored in a memory such as memory 586. This look up table may then be used in finding the optimized configuration by the other algorithms described herein. This type of calibration may be performed only once during initial bring up of the system, may be done at each startup of the system, and/or may be done upon physical alteration of the cooled region (e.g., upon addition/removal of components). Alternatively, the calibration may be performed at regular time interval, which may also help monitor the aging of the cooling unit 310. In some embodiments, this method may be considered a coarse calibration method, after which fine tuning may take place. The calibration procedure may also be done to determine the influence of other operating parameters. For example, the calibration process may be performed for different processor loads running on e.g., processor 330. In another example, the calibration steps may be performed while maintaining different target temperatures of one or more components, such as e.g., processor 330, or electronic component 350, for different operating conditions. In some embodiments, calibration can also be triggered on demand. Some examples of on-demand calibration include calibration remotely by the equipment provider and calibration locally triggered such as by a technician. In some embodiments, calibration may be included as an aspect of routine or other of self-diagnostics.

Figure 7:
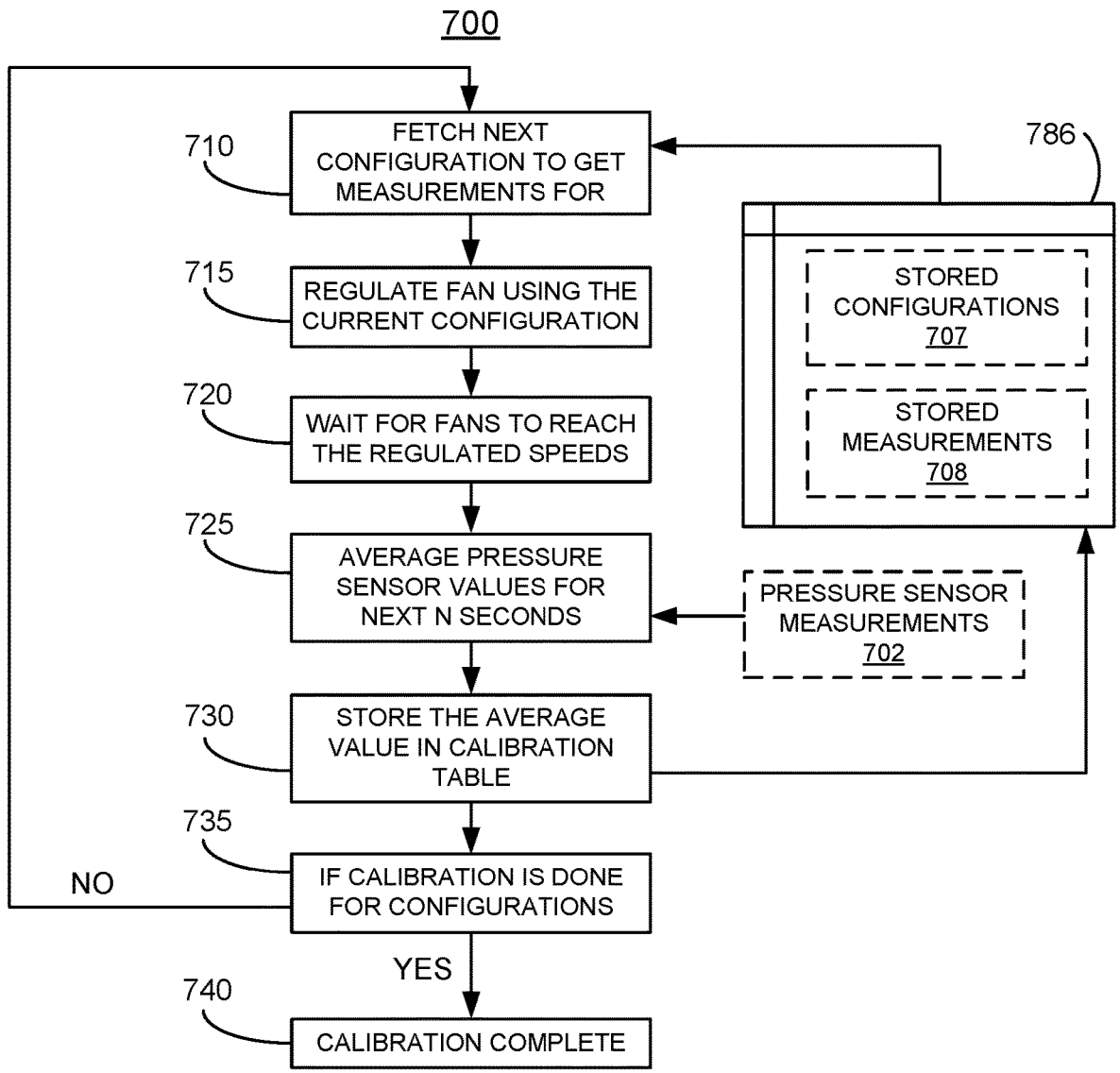
FIG. 7 illustrates a flow diagram of an example method of cooling unit calibration, in accordance with various embodiments.

FIG. 7 illustrates a flow diagram 700 of an example method of cooling unit calibration, in accordance with various embodiments. In flow diagram 700 it should be noted that the different procedures may be performed in a different order, that some of the procedures may be optional or not required, that some procedures may be combined, and/or that additional procedures may be performed.

At 710 of flow diagram 700, an operating configuration is fetched/obtained from a set of operating configurations 707 which are stored in a storage 786 (which may be a memory such as memory 586 or may be other storage). Each operating configuration specifies independent speed for each of the fans 311 in a cooling unit 310. In some operating configurations, all of the fans 311 may be specified to operate at the same speed while in other operating configurations one or more of the fans 311 may be specified to operate at a different speed from one or more other fans. In some embodiments, the set of stored operating configurations 707 may comprise a permutation of the operating configurations for all of the fans 311 in which each fan is altered by a speed step of 3%, 5%, 10%, or some other percentage between 0% and 100% of the possible speed of the fan 311.

At 715 of flow diagram 700, the fans 311 are each regulated to the speed specified by the fetched operating configuration. This regulation may be done by a controller on board cooling unit 310 or by another processor, such as processor 330 or sensor processor 581.

At 720 of flow diagram 700, the process waits for a predetermined time, such as 15 seconds, one minute, or some other predetermined amount of time for the fans 311 to reach their regulated speed.

At 725 of flow diagram 700, the average pressure sensor values for some or all pressure sensors 360 in a cooling system 600 are averaged for each pressure sensor over a span of N seconds, where N is a predetermined number of seconds. For example, N may be 1 second, 10 seconds, 200 seconds, or some other number of seconds where the pressure sensors 360 capture pressure sensor measurements 702. In some embodiments, the pressure difference between certain pressure sensors are determined. For example, the pressure difference over components for which the cooling is monitored, such as e.g., processor 330 and/or electronic component 350, is determined and stored. In some embodiments, the pressure sensor measurements 702 may comprise contemporaneously captured pressure measurements from a pressure sensor 160 which measures an ambient pressure outside of the region being cooled by cooling system 600.

At 730 of flow diagram 700, the average values are stored in a calibration table as stored measurements 708 and are associated with the operating configuration of the stored operating configurations 707 which was used to generate the average values.

At 735 of flow diagram 700, if, a check is made to determine if calibration has been done on each of the plurality of stored operating configurations. The plurality of operating configurations may comprise variations of operating parameters other than the fans speeds, such as e.g., processor load, target temperatures, etc. If not, then the flow diagram repeats starting at 710 with a new configuration being selected from stored operating configurations 707. If so, then the process moves to 740 and calibration is complete.

Fine Tuning

The calibration method discussed above (e.g., flow diagram 700) may be used to find an operating configuration or to calibrate an operating configuration. An operating configuration may also be selected from a set of stored operating configurations 707 in, for example, a look-up table. The selected operating configuration may be fine-tuned by making small changes in fan speeds and then monitoring the results. The "small change" is less than a normal step increment (e.g., 5%) in speed increase or decrease for a fan represented by the stored operating configurations 707 of FIG. 7. For example, for a particular operating configuration, a 0.25%, 0.5%, 1%, or other small change in the speed of one fan 311 may be made and then pressure difference at the core/target cooling area may be monitored. Positive and/or negative changes in speed may be made during the fine tuning. Each of the fans 311 may be similarly tested and monitored such that a number of permutations of small changes for an operating condition are tested in the fine-tuning. An example embodiment of this fine tuning is represented by the flow diagram 800 of FIG. 8.

Also, from the power and configuration relationship an algorithm may calculate the power consumed by this fine-tuned configuration. In some embodiments, fine tuning identifies an operating configuration that gives more cooling while keeping while power constant or using less power. In some embodiments, fine tuning identifies an operating configuration that gives the same amount of cooling (as may be called for) while using less power than another operating configuration. Fine tuning may be performed regularly, for example when the processing load or temperature changes by more than a predefined threshold value.

Figure 8:
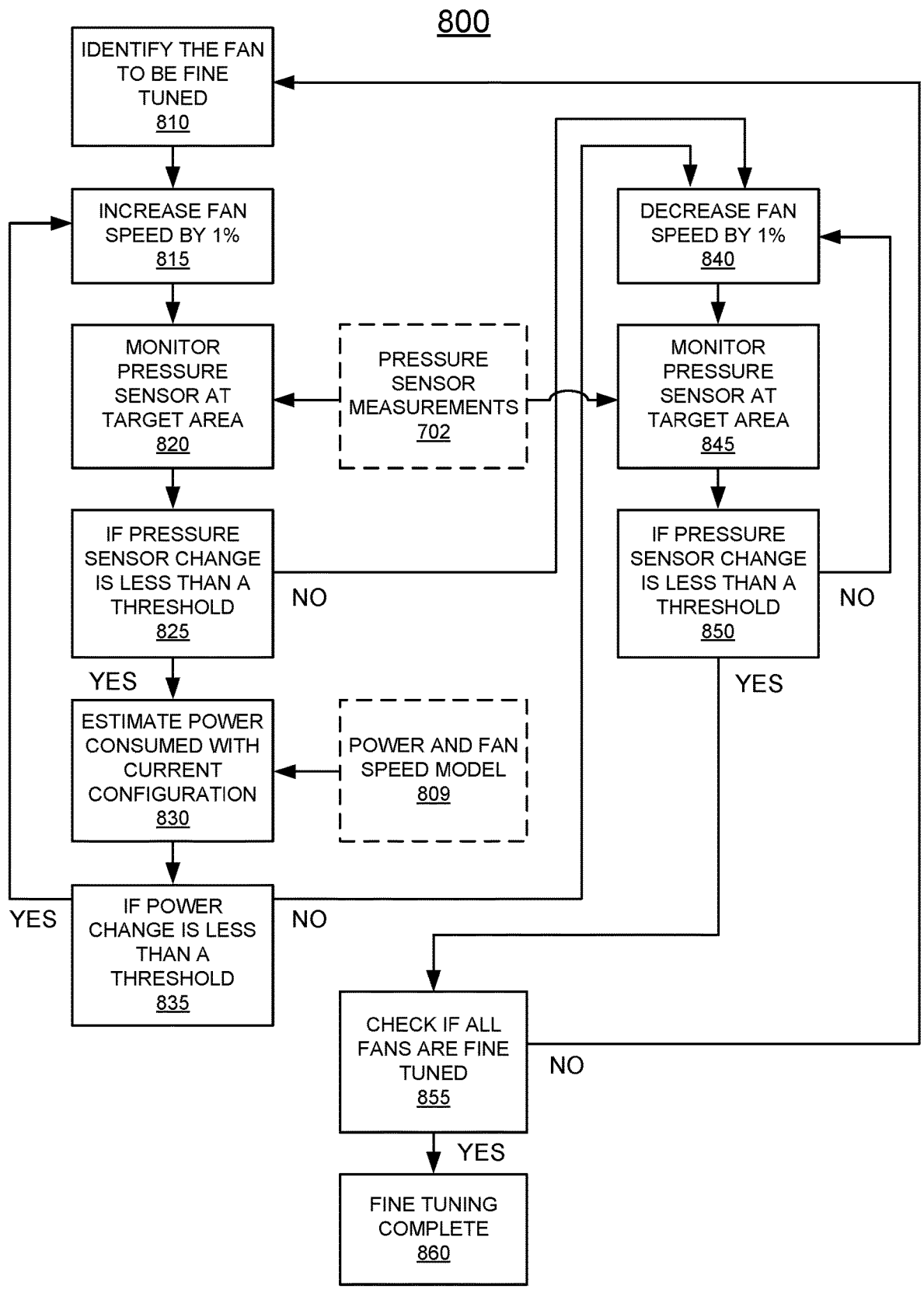
FIG. 8 illustrates a flow diagram of an example method of cooling unit fine tuning, in accordance with various embodiments.

FIG. 8 illustrates a flow diagram of an example method of cooling unit fine tuning, in accordance with various embodiments. In flow diagram 800 it should be noted that the different procedures may be performed in a different order, that some of the procedures may be optional or not required, that some procedures may be combined, and/or that additional procedures may be performed.

At 810 of flow diagram 800 a fan 311 (e.g., fan 311-1) in a cooling unit 310 is selected for fine tuning with respect to an operating configuration of a plurality of stored operating configurations 707.

At 815 of flow diagram 800, the speed of the fan 311 is increased by a small amount, 1% in this example.

At 820 of flow diagram 800, pressure is monitored using pressure sensor measurements 702 obtained from one or more pressure sensor 360 at the target region(s). The target region may be a single region, such as at or near a processor/core (e.g., pressure sensor 360-1 and/or 360-2 may be monitored). There may also be multiple cooling regions which are monitored. For example, multiple portions of a circuit board or multiple electronic components in different regions of an enclosure may be monitored and may be cooled according to different cooling specifications (e.g., different temperatures, airflows, air pressures, etc.).

At 825 of flow diagram 800, if the pressure sensor change is less than a threshold (e.g., 0.75 pascal, 1 pascal, etc.) which has been pre-established then the method proceeds to 830, if not the method proceeds to 840.

Figure 9:
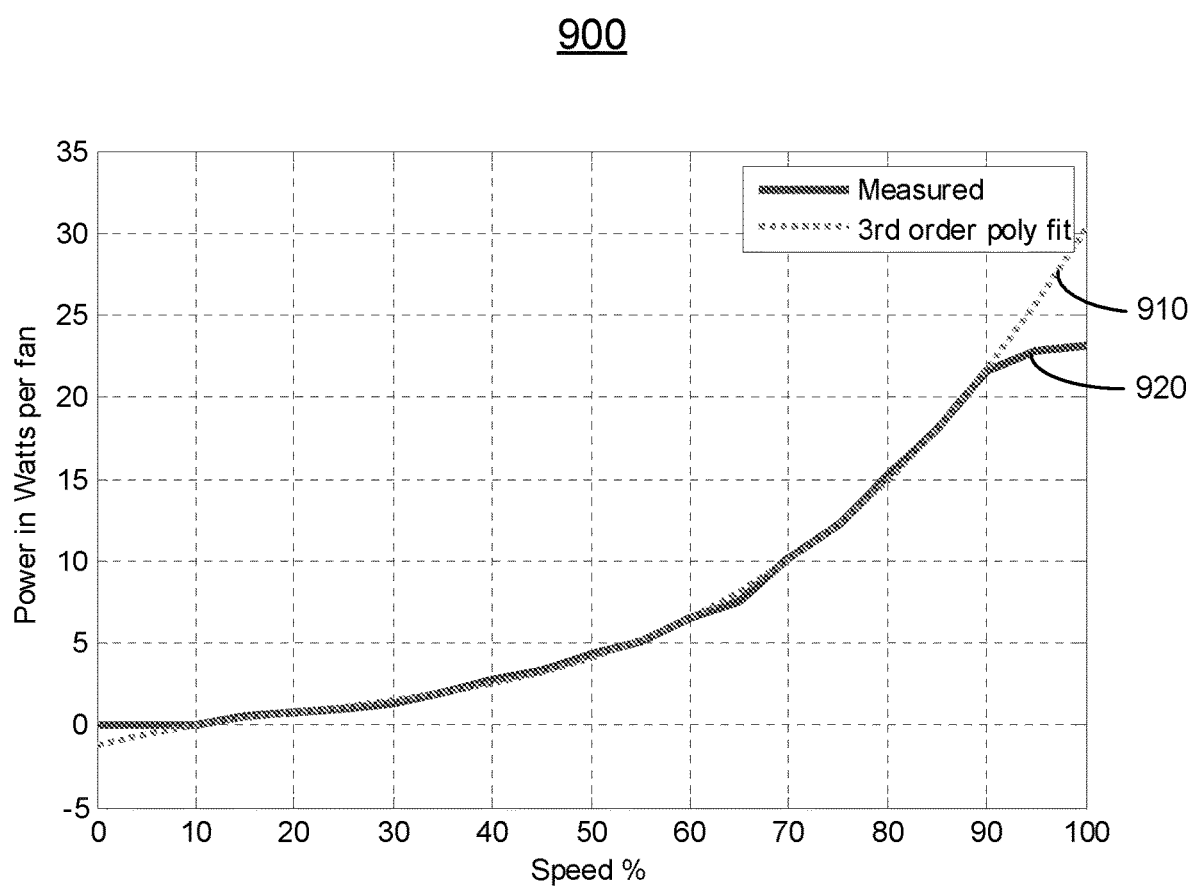
FIG. 9 illustrates a diagram of power consumed by a given fan in a cooling unit for a given speed of operation of the fan.

At 830 of flow diagram 800, at estimate is made of the power consumed with the currently fine-tuned operating configuration using a power and fan speed model 809 which may be provided (such as a factory specification) or empirically determined and may be stored in storage 786 or elsewhere. FIG. 9 illustrates a graph of a third order polynomial 910 which may be used as power and fan speed model 809. As an alternative, in some embodiments, power usage can just be directly measured or a direct or indirect measurement can be obtained.

At 835 of flow diagram 800, if, if the power change is less than a predetermined threshold amount (e.g., 0.1 watts, 0.25 watts, etc.) the method proceeds to 815 to further increase the speed of the fan, if not it proceeds to 840 to decrease the speed of the fan.

At 840 of flow diagram 800, if, the speed of the fan 311 is decreased by a small amount, 1% in this example, from the original operating configuration speed.

At 845 of flow diagram 800, if, pressure is monitored using pressure sensor measurements 702 obtained from one or more pressure sensor 360 at the target region(s). The target region may be a single region, such as at or near a processor/core (e.g., pressure sensor 360-1 and/or 360-2 may be monitored). There may also be multiple cooling regions which are monitored. For example, multiple portions of a circuit board or multiple electronic components in different regions of an enclosure may be monitored and may be cooled according to different cooling specifications (e.g., different temperatures, airflows, air pressures, etc.).

At 850 of flow diagram 800, if the pressure sensor change is less than a threshold (e.g., 0.75 pascal, 1 pascal, etc.) which has been pre-established then the method proceeds to 840 and speed of the fan is further decreased, if not the method proceeds to 855.

At 855 of flow diagram 800, a check is made to determine if fine tuning has been accomplished for all of the fans 311 of a cooling unit. If not, the method returns to procedure 810 and another of the fans 311 (e.g., fan 311-2) of the cooling unit is selected for fine tuning. If so, the method moves to procedure 860 and fine tuning is considered complete.

It is appreciated that pressure values obtained and/or power values calculated during a fine-tuning operation may be stored in association with the stored operating configurations 707.

FIG. 9 illustrates a diagram 900 of power consumed by a given fan 311 in a cooling unit 310 for a given speed of operation of the fan. In diagram 900 the x-axis is fan speed from 0% to 100%, while the y-axis is power in watts used per fan. Line 920 represents the measured data. Line 910 represents a third order polynomial fit to this data. This third order polynomial can be used to calculate, fairly accurately, the power used by a fan at any particular percentage of its maximum operating speed. An equation for the third order polynomial 910 or other representation thereof may be stored, in storage 786, as power and fan speed model 809. The third order polynomial 910 (or other equation fit to line 920) comprises information which may be precalculated for a particular cooling unit 310 (such as at a factory or by a manufacturer) and provided as a specification of the fans 311 in the cooling unit 310. Because of the third order nature of the relationship between power and fan speed, even small decreases in fan speed decrease power use more than if there were a simple linear relationship between the two.

Fan Power Optimization

Figure 10:
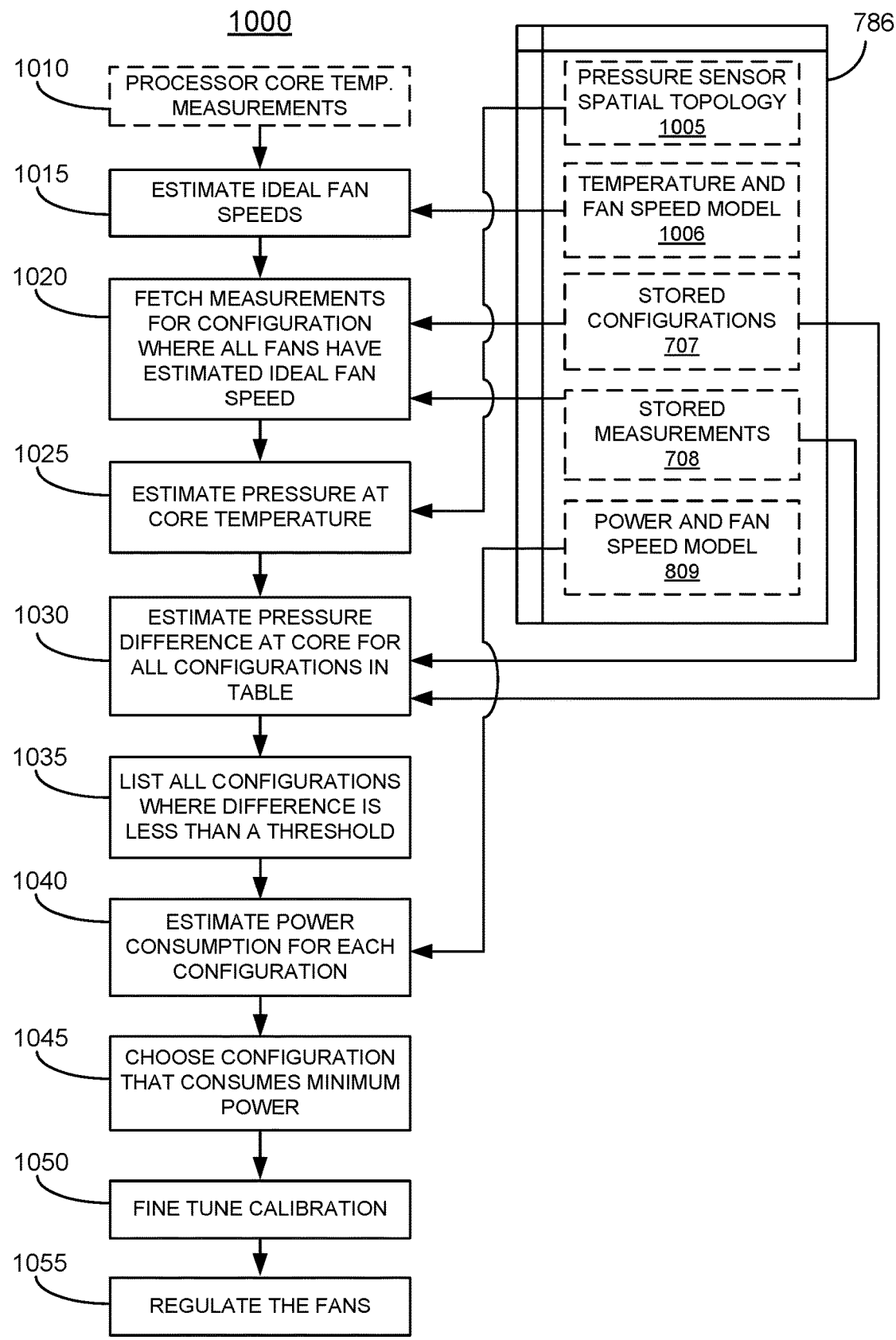
FIG. 10 illustrates a flow diagram of an example method of cooling unit fan power optimization, in accordance with various embodiments.

FIG. 10 illustrates a flow diagram 1000 of an example method of cooling unit fan power optimization, in accordance with various embodiments. In flow diagram 1000 it should be noted that the different procedures may be performed in a different order, that some of the procedures may be optional or not required, that some procedures may be combined, and/or that additional procedures may be performed. In the example illustrated by flow diagram 1000 the target region for cooling is the processor/core of a server computer. It should be appreciated that in other embodiments there may be other and or multiple areas/regions/circuit board portions of interest for cooling and optimization of cooling unit fan power.

At 1010 of flow diagram 1000, a current temperature of the processing core temperature is obtained such as from a temperature sensor near the core. With reference to FIG. 3B, this may comprise obtaining the temperature from pressure sensor 360-1 or pressure sensor 360-2, either or both of which may also be configured to measure temperature as well as air pressure. In other embodiments, the temperature may be obtained from a temperature sensor located in or near processor 330. If there is another area of interest aside from or in addition to the processor/core, the current temperature for that area of interest is acquired in a similar fashion.

At 1015 of flow diagram 1000, an estimate of the ideal fan speed is made using temperature and fan speed model 1006. This temperature and fan speed model 1006 set of predetermined or empirically measured values stored in storage 786. For example, Equation 7 discussed above may be utilized to calculate this estimate of fan speed in a situation where all fans 311 of a cooling unit 310 are operating at the same speed. Using this speed, Fserver=[s, s, s] for cooling unit 310 because f1=f2=f3=s. Additionally, a model may be created for each fan 311 in the manner illustrated in FIG. 11.

At 1020 of flow diagram 1000, stored measurements 708 are fetched for the operating configuration of stored operating configurations 707 where all fans 311 of cooling unit 310 are operating at the estimated ideal fan speed of f1=f2=f3=s. These measurements were stored or previously obtained empirically.

At 1025 of flow diagram 1000, an estimate is made of the air pressure at the processor/core temperature which was obtained in 1010. For Fserver, defined above, from the relationship F→P the air flow at processor 330 is given, and can be referred to as Pcore_server. Pcore_server becomes the cooling specification and specifies the target airflow for the temperature T, of processor 330. Here the airflow is compared to a situation where all the fans 311 in cooling unit 310 are set to spin at the same speed. In a similar manner any desired air flow or pressure difference over processor 330 may be defined as desired or requested. Input regarding the locations of pressure sensors 360 may be obtained from stored pressure sensor spatial topology 1005 and used to select a set of pressure sensors 360 to monitor for changes in pressures across a processor, such as processor 330. For example, pressure sensors 360-1 and 360-2 would be selected to monitor air pressure at processor 330 at any core temperature.

This required pressure sensor difference between pressure sensors 360-1 and 360-2 across processor 330 is the value which would be obtained if the fans 311 in cooling unit 310 were all operated at the same speed. The aim then, is to achieve the same required pressure sensor difference between pressure sensor 360-1 and pressure sensor 360-2 at processor 330 but use less power by not running all fans 311 of cooling unit 310 at the same speed as one another. Consider a new configuration F creating an airflow P and airflow at core as Pcore. The difference of airflow processor/core 330 between configuration F and configuration Fserver is given as |Pcore−Pcore_server| which is absolute difference of values at p1 and p2 (pressures measured by pressure sensors 360-1 and 360-2) in FIG. 3B.

At 1030 of flow diagram 1000, an estimate of pressure difference at the processor/core is made for all operating configurations 707 stored (such as in a look up table) in storage 786.

At 1035 of flow diagram 1000, a list is made of all of the operating configurations where the difference is less than a predetermined threshold value. This list will contain all of the operating configurations which provide the same pressure sensor difference across processor 330. Configuration F is considered given same air flow as Fserver only if |Pcore−Pcore_server|<threshold. This condition is if all the values in the vector are less than the threshold. This means the absolute difference of values at p1 and p2 for both F and Fserver, should be less than threshold. There will be multiple configurations F that satisfy the requirement |Pcore−Pcore_server|<threshold. These matching configurations may be referred to as F_list.

At 1040 of flow diagram 1000, an estimated power consumption for each of the operating configurations in the list, F_list, is calculated. This is done by accessing the power and fan speed model 809 values which have been previously stored. These power and fan speed model 809 values can be provided or may be empirically determined by operating the fans 311 at different speeds and measuring the power consumed. FIG. 9 illustrates an example third order polynomial 910 which represents power used in watts per fan at different fan speeds. This third order polynomial 910 was determined by fitting it to power used data which was measured when actual fans were operated at different speeds. For each configuration on the list, an estimate the power consumption of the fans 311 of cooling unit 310 is made using the average power consumption of a fan at a given speed in the operating configuration. For example, using the power measurement as Power(F)=ΣPower(fi) the power for each configuration in F_list can be calculated.

At 1045 of flow diagram 1000, an operating configuration from the list, F_list, is identified and chosen that consumes the minimum power when compared to the other operating configurations on the list. This identified operating configuration is considered the optimized operating configuration. The optimized configuration, Fopt, will be the operating configuration of the list of operating configurations F_list which uses the least power. That is, Fopt=F_list such that Power(Fopt)=min(Power(F_list)). If several configurations have the same power usage, other criteria may be used to select the most appropriate optimized configuration to employ. For example, in one embodiment, when multiple operating configurations use the same amount of power, the operating configuration have the smallest possible difference in speed of the different fans 311 in a cooling unit would be chosen.

At 1050 of flow diagram 1000, after the optimized operating configuration is chosen, in some embodiments it may be fine-tuned. The fine tuning may be performed in any manner including in the manner described in conjunction with flow diagram 800 of FIG. 8.

At 1055 of flow diagram 1000, the fans 311 of cooling unit are regulated at the speeds of the chosen optimized configuration or at the optimized configuration as modified by any fine tuning.

Using the power estimated for the configuration when all fans are working together versus the optimized configuration obtained, the power savings for the given operating core temperature and the chosen optimized operating configuration versus running all fans at the same speed can be calculated as shown in Equation 8.

Power saving($T$)=Power(Fopt($T$))−Power(Fserver($T$))   Equation 8

The procedures illustrated and described in conjunction with flow diagram 1000 show an example embodiment. Other embodiments are possible using the same principles. In some embodiments, not all configurations are tested, for example the process may start at the operating configuration with the lowest power consumption, and then vary the operating configuration with increasing power consumption until the desired core cooling is achieved. The requirements or inputs to the method illustrated in flow diagram 1000 may be a desired airflow over the processor unit, or a required temperature of the processor. The optimization may involve a desired temperature or air flow for one area, e.g., processor 330, but may also involve a desired temperature or air flow for more areas, e.g., processor 330 and electronic component 350. Different priorities or importance may be given to the different regions/areas/circuit board portions being cooled. The system may also need as input the relation between the position of the pressure sensor, and the areas of interest. The temperature may be measured by the processor, the pressure sensor, or by a dedicated temperature sensor.

FIG. 11 illustrates a diagram 1100 of the relationship between core temperature of a processor core with uniform fan speed of a set of fans in a cooling unit. In diagram 1100 the x-axis is temperature of a processing core in degrees centigrade, while the y-axis is percentage of the speed of a fan's maximum operating speed. Data points 1110 represent the measured data. Line 1120 represents a line fit to the measured data, such as through linear regression or other means. Line 1120 or its equation can be used to calculate, fairly accurately, the conventional speed that a fan 311 would be set at for any core temperature of a processing core cooled by fans of cooling unit 310 (when operated at uniform speed). An equation for the line 1120 or other representation thereof may be stored, in storage 786, as temperature and fan speed model 1006. Line 1120 comprises information which may be precalculated empirically for a particular cooling unit 310 (such as at a factory or by a manufacturer) and cooled circuit board. In some embodiments, information provided by line 1120 may be determined or provided for other regions of interest of a circuit board or space being cooled by a cooling unit 310.

Example Method(s) of Operation

FIG. 12 illustrate a flow diagram 1200 of an example method operating a cooling unit, according to various embodiments. Procedures of this method will be described with reference to elements and/or components of one or more of FIGS. 1-11. It is appreciated that in some embodiments, the procedures may be performed in a different order than described, that some of the described procedures may not be performed, and/or that one or more additional procedures to those described may be performed. Flow diagram 1200 includes some procedures that, in various embodiments, are carried out by one or more processors (e.g., sensor processor 581 of sensor processing unit 340) under the control of computer-readable and computer-executable instructions that are stored on non-transitory computer-readable storage media (e.g., memory 586). It is further appreciated that one or more procedures described in flow diagram 1200 may be implemented in hardware, or a combination of hardware with firmware and/or software. Additionally, it should be appreciated that the procedures are being described with respect to circuit boards and servers, however, uses are not so limited and these procedures and the technology which supports them may be employed to cool other equipment and/or enclosures.

With reference to FIG. 12, at procedure 1210 of flow diagram 1200, in various embodiments, a processor obtains air pressure data measured by a plurality of pressure sensors disposed within a rack unit. The processor may be any processor, including a sensor processor 581 of a sensor processing unit 340. The pressure sensors may be the same or similar to pressure sensors 360, and in some embodiments may sense other environmental characteristics such as temperature as well. In some embodiments, the processor is coupled with the plurality of pressure sensors. This coupling may be any type of coupling such as direct wire line connections, a bus, a wireless coupling, or some combination thereof.

The plurality of pressure sensors includes at least a first pressure sensor and a second pressure sensor. With reference to FIGS. 1, 3A-4, and 6, pressure sensors 160 and 360 are some example of the pressure sensors. A first pressure sensor is located between a portion of a circuit board and a cooling unit which generates airflow over the circuit board. The "portion" is a portion of the circuit board for which cooling is monitored and adjusted. The portion may include one or more heat sensitive components and/or a heatsink for such components. In one embodiment, the first pressure sensor is configured to measure air pressure data at a location of the first pressure sensor. A second pressure sensor is located such that the portion of the circuit board is between the second pressure sensor and the cooling unit. The second pressure sensor configured to measure air pressure data at a location of the second pressure sensor. With reference to FIG. 3B as an example, the first pressure sensor may be pressure sensor 360-1, which is located between a portion, processor 330, of circuit board 320-1 and cooling unit 310. With continued reference to FIG. 3B, the second pressure sensor may be pressure sensor 360-2 which is located such that processor 330 is between pressure sensor 360-2 and cooling unit 310. In this manner, processor 330 is located between pressure sensor 360-1 and pressure sensor 360-2 in the path of the direction 120 of cooling air inside of rack unit 110B.

In a similar fashion other portions or designated regions of a cooled space may be monitored using one or more additional pressure sensors. For example, with reference to FIG. 3B a third pressure sensor 360-10 is located such that a different portion of circuit board 320-1 is between it and cooling unit 310 that the portion which is between pressure sensor 360-2 and cooling unit 310. Air pressure data measured by pressure sensor 360-10 can be used alone or in comparison to air pressure data measured by pressure sensor 360-11 to monitor cooling of this second portion (i.e., the region of SPU 340) of circuit board 320-1. Similarly, pressure sensor 360-7 is located between electronic component 350 and cooling unit 310, while pressure sensor 360-9 is located such that electronic component 350 is between it and cooling unit 310. Air pressure data measured by pressure sensor 360-7 can be used in comparison to air pressure data measured by pressure sensor 360-9 to monitor cooling of electronic component 350. In general, the first and second pressure sensors are positioned so that the portion of the circuit board for which the cooling is monitoring and adjusted is in between the first and second pressure sensors in the direction of the expected air flow. Additional pressure sensors not in the direction of the expected air flow may also be used to provide additional information on the air flow in the system.

With reference to FIG. 12, at procedure 1220 of flow diagram 1200, in various embodiments, the processor adjusts an operating configuration of the cooling unit based on a cooling specification and a comparison of the obtained air pressure data measured by the first pressure sensor and the second pressure sensor. Pressure data from additional pressure sensors may also be used to adjust the operating configuration. With continued reference to FIG. 3B, a processor such as sensor processor 581 of sensor processing unit 340 may adjust the operating configuration of cooling unit 310 or communicate with a controller or processor of cooling unit 310 to cause the adjustment of its operating configuration. The adjustment is made based on a cooling specification and a comparison of the air pressure data measured by pressure sensor 360-1 to the air pressure data measured by pressure sensor 360-2. The cooling specification may be stored in a memory, such as memory 586, or other storage which is accessible to the processor. The cooling specification may be for one or more portions or designated regions which are monitored with pressure sensors. The cooling specification may prescribe predetermined air flow quantities for one or more designated regions in a housing/enclosure. In a similar fashion to storage of the cooling specification, a plurality of operating configurations may be stored in a memory, such as memory 586, or other storage which is accessible to the processor. The comparison of the air pressure data from the first and second pressure sensors may comprise a difference, an absolute value of a difference, or some other comparison.

In some embodiments, the processor adjusts the operating configuration of the cooling unit to achieve a target air flow for the portion of the circuit board and a second target air flow for a second portion of the circuit board, and wherein the target air flow and the second target air flow are different. With reference to FIG. 3B, this may comprise sensor processor 581 or another processor adjusting the operating configuration of cooling unit 310 to provide a first target air flow over the region of circuit board 320-1 where processor 330 is locates and a second target air flow over the region of circuit board 320-1 where SPU 340 is located. The target air flows may both be described in a cooling specification and stored operating configurations 707 for cooling unit 310 and stored measurements 708 for the respective operating configurations of cooling unit 310 may be evaluated to determine which will provide the target air flows that are specified. Those that satisfy the cooling specification may be evaluated to see which among them uses the least power and it may be chosen. This chosen operating configuration may then be fine-tuned and then implemented or simply implemented to regulate the speeds of the fans 311 of cooling unit 310. The cooling specification may be dependent on operating parameters of the system, such as e.g., temperature or processor load, as is discussed in more detail below.

In some embodiments, the processor adjusts the operating configuration based on a cooling specification, wherein the operating configuration specifies independent speed settings for each of the fans of the cooling unit, and wherein at least two of the independent speed settings are different from one another. This may comprise sensor processor 581 or another processor utilizing an operating configuration of stored operating configurations 707 which specifies independent fan speed settings for each fan 311 of cooling unit 310. In some embodiments, at least two of the independent speed settings are different from one another (e.g., set fan 311-1 to 50% of full speed, set fan 311-2 to 25% of full speed, and set fan 311-3 to 40% of full speed).

In some embodiments, the processor adjusts the operating configuration of the cooling unit based on the cooling specification, wherein the cooling specification varies in a predetermined relationship to a load of a second processor which is disposed on the circuit board. In other words, for different loads of the second processor, a different cooling specification exists, such as e.g., a different air flow for different processor loads. With reference to FIG. 3B, this may comprise sensor processor 581 or another processor adjusting the operating configuration of cooling unit 310 to satisfy the cooling specification requirements that change as the load on processor 330 changes. For example, the cooling specification may specify a certain pressure differential between pressure sensors 360-1 and 360-2, and this pressure differential may change with different loads on processor 330. For example, in one embodiment, the differential may be specified to be 8 pascal at 40% load, 10 pascal at 50% load, 12 pascal at 60% load, 14 pascal at 70% load, 16 pascal at 80% load, 18 pascal at 90% load, and 20 pascal at 100% load of processor. Of course, other predetermined relationships are possible. In general, for a higher load of processor, more heat is generated, and therefore more airflow is required. Processor 581 may select from stored operating configurations 707 for cooling unit 310 and stored measurements 708 to choose operating configurations of cooling unit 310 which meet the cooling specification for a current load of processor 330. Those that satisfy the cooling specification for a current load of processor 330 may be evaluated to see which among them uses the least power and it may be chosen. This chosen operating configuration may then be fine-tuned and then implemented or simply implemented to regulate the speeds of the fans 311 of cooling unit 310.

Whenever the load on processor 330 changes, the operating configuration of the cooling unit may be adjusted to provide the appropriate cooling as required by the cooling specification. The load change may have to be larger than a predefined threshold compared to the previous load for which the operating configuration were adjusted in order to avoid a continuous adjustment process. For example, in some embodiments, the load change must be more than 2%, 5%, 10%, or any other percentage, before the adjusting of the operating configuration is initiated.

In some embodiments, the processor adjusts the operating configuration of the cooling unit based on the cooling specification to minimize power consumption of the cooling unit while maintaining a predetermined temperature of the portion of the circuit board. With reference to FIG. 3B, this may comprise sensor processor 581 or another processor adjusting the operating configuration of cooling unit 310 to satisfy the cooling specification requirements while minimizing power consumption of cooling unit 310. For example, the cooling specification may specify a certain temperature be maintained at a component such as a processor/core. Processor 581 may select from stored operating configurations 707 for cooling unit 310 and stored measurements 708 to choose operating configurations of cooling unit 310 which meet the cooling specification for maintaining a certain maximum temperature of processor 330. Those that satisfy the cooling specification may be evaluated to see which among them uses the least power and it may be chosen. In this way, power consumption is minimized. This chosen operating configuration may then be fine-tuned and then implemented or simply implemented to regulate the speeds of the fans 311 of cooling unit 310. The target temperature may be constant or may depend on the processor load, where for different processor loads, different target temperatures are defined. In some embodiments, the processor adjusts the operating configuration to operate under a certain power allowance. For example, a target temperature may be set, and the system may then adjust the processor load and cooling configuration to maximize the processor load for the cooling configuration that consumes the power according to the power allowance.

In some embodiments, the processor adjusts the operating configuration of the cooling unit based on the cooling specification to minimize power consumption of the cooling unit while maintaining the comparison of the obtained air pressure data from the first pressure sensor and the second pressure sensor at a predetermined pressure difference. With reference to FIG. 3B, this may comprise sensor processor 581 or another processor adjusting the operating configuration of cooling unit 310 to satisfy the cooling specification requirement for a certain pressure difference between two pressure sensors while minimizing power consumption of cooling unit 310. For example, the cooling specification may specify a certain pressure differential be maintained between pressure sensors 360-1 and 360-2 which fore and aft processor 330 in the direction of cooling air flow. Processor 581 may select from stored operating configurations 707 for cooling unit 310 and stored measurements 708 to choose operating configurations of cooling unit 310 which meet the cooling specification for maintaining a specified a of processor 330. Those that satisfy the cooling specification may be evaluated to see which among them uses the least power and it may be chosen. In this way, power consumption is minimized while the pressure difference between two pressure sensors is maintained. This chosen operating configuration may then be fine-tuned and then implemented or simply implemented to regulate the speeds of the fans 311 of cooling unit 310.

In some embodiments, the processor adjusts the operating configuration of the cooling unit based on the cooling specification to minimize power consumption of the cooling unit while maintaining a predetermined air flow across the portion of the circuit board. With reference to FIG. 3B, this may comprise sensor processor 581 or another processor adjusting the operating configuration of cooling unit 310 to satisfy the cooling specification requirement for a certain air flow level across a particular portion of a circuit board (or some other location that is being cooled) while minimizing power consumption of cooling unit 310. For example, the cooling specification may specify a certain air flow be maintained between pressure sensors 360-1 and 360-2 which fore and aft processor 330 in the direction of cooling air flow. Airflow is measured as square root of pressure difference multiplied by a constant. The constant depends on the physical structure of the device and difference is calculated as the abs(value measured−ambient). Processor 581 may select from stored operating configurations 707 for cooling unit 310 and stored measurements 708 to choose operating configurations of cooling unit 310 which meet the cooling specification for maintaining a specified a of processor 330. Those that satisfy the cooling specification may be evaluated to see which among them uses the least power and it may be chosen. In this way, power consumption is minimized while the air flow across processor 330 maintained. This chosen operating configuration may then be fine-tuned and then implemented or simply implemented to regulate the speeds of the fans 311 of cooling unit 310.

In some embodiments, the cooling specification describes a preset power allowance for the cooling unit. In such an embodiment, the processor adjusts the operating configuration of the cooling unit according to the preset power allowance for the cooling unit such that an operating configuration is selected which either matches or is below the power allowance (depending on what is specified in the power allowance).

The discussions of the air flow optimization have been mostly discussed in relation to FIG. 3B representing, for example, a server rack unit 110 as depicted in FIG. 2. The server rack unit 110 may be part of a server rack 100 as shown in FIG. 1. When several server rack units are mounted together in a server rack, the thermodynamic of the individual server unit may change due to the presence of the other server units. Moreover, several server racks may be located in close proximity, as is often the case in so-called server farms. The presence of other server rack units may be taken into consideration in the operating configuration. For example, the operating configuration and/or or cooling specification may contain parameters concerning the position of the rack unit within a rack and the presence of the other units. The intake of air of the different units may also be different depending on the location (i.e., bottom of a rack, middle of a rack, top of a rack) of the units with a rack. For example, the temperature of the incoming air may depend on the position with respect to other units, but also with respect to location of the air ducts in the server room. In any case, any relevant parameters that influence the cooling may be taking into consideration into the operating configuration and/or cooling specification, and as such will be considered in the air flow optimization processes and embodiments as described above.

CONCLUSION

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed. Rather, the specific features and acts described above are disclosed as example forms of implementing the claims.

Reference throughout this document to "one embodiment," "certain embodiments," "an embodiment," "various embodiments," "some embodiments," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics of any embodiment may be combined in any suitable manner with one or more other features, structures, or characteristics of one or more other embodiments without limitation.

What is claimed is:

1. A circuit board cooling system comprising:
    a cooling unit comprising at least two fans configured to generate air flow to cool a portion of a circuit board, the cooling unit configured to operate according to an operating configuration;
    a plurality of pressure sensors configured to measure air pressure data at their respective locations, the plurality of pressure sensors comprising:
        a first pressure sensor located between the portion of the circuit board and the cooling unit and configured to measure air pressure data at a location of the first pressure sensor; and
        a second pressure sensor located such that the portion of the circuit board is between the second pressure sensor and the cooling unit, the second pressure sensor configured to measure air pressure data at a location of the second pressure sensor; and
    a sensor processing unit coupled with the plurality of pressure sensors and configured to:
        obtain the air pressure data measured by the plurality of pressure sensors; and
        adjust the operating configuration of the cooling unit based on a cooling specification and a comparison of the obtained air pressure data measured by the first pressure sensor and the second pressure sensor.

2. The circuit board cooling system of claim 1, further comprising a third pressure sensor located such that a second portion of the circuit board is between the third pressure sensor and the cooling unit, wherein the third pressure sensor is configured to measure air pressure data at a location of the third pressure sensor, and wherein the second portion of the circuit board is different from the portion of the circuit board.

3. The circuit board cooling system of claim 2, wherein the cooling specification comprises:
    a target air flow for the portion of the circuit board and a second target air flow for the second portion of the circuit board, and wherein the target air flow and the second target air flow are different.

4. The circuit board cooling system of claim 1, wherein the operating configuration of the cooling unit comprises:
    independent speed setting for each of the fans of the cooling unit.

5. The circuit board cooling system of claim 1, wherein the cooling specification varies in a predetermined relationship to a load of a processor disposed on the circuit board.

6. The circuit board cooling system of claim 1, wherein the cooling specification comprises:
    predetermined air flow quantities for designated regions within a housing in which the first pressure sensor and the second pressure sensor are disposed and to which the cooling unit is coupled.

7. The circuit board cooling system of claim 1, wherein the cooling specification comprises:
    minimization of power consumption of the cooling unit while maintaining a predetermined temperature of the portion of the circuit board.

8. The circuit board cooling system of claim 1, wherein the cooling specification comprises:
    minimization of power consumption of the cooling unit while maintaining the comparison of the obtained air pressure data from the first pressure sensor and the second pressure sensor at a predetermined pressure difference.

9. The circuit board cooling system of claim 1, wherein the cooling specification comprises:
    minimization of power consumption of the cooling unit while maintaining a predetermined air flow across the portion of the circuit board.

10. The circuit board cooling system of claim 1, wherein adjusting the operating configuration comprises:
    adjusting the operating configuration according to a preset power allowance for the cooling unit.

11. The circuit board cooling system of claim 1, wherein the sensor processing unit is configured to adjust the operating configuration of the cooling unit based on a cooling specification and a comparison of the obtained air pressure data measured by the first pressure sensor and the second pressure sensor comprises:
    the sensor processing unit configured to adjust the operating configuration of the cooling unit such that at least one fan of the cooling unit runs at a different speed setting from another fan of the cooling unit.

12. A rack unit for a server rack, the rack unit comprising:
    a housing;
    a cooling unit configured to couple with the housing and comprising at least two fans configured to generate air flow to cool a portion of a circuit board, the cooling unit configured to operate according to an operating configuration;
    a plurality of pressure sensors disposed with the housing and configured to measure air pressure data at their respective locations, the plurality of pressure sensors comprising:
        a first pressure sensor located between the portion of the circuit board and the cooling unit and configured to measure air pressure data at a location of the first pressure sensor; and
        a second pressure sensor located such that the portion of the circuit board is between the second pressure sensor and the cooling unit, the second pressure sensor configured to measure air pressure data at a location of the second pressure sensor; and
    a sensor processing unit coupled with the plurality of pressure sensors and configured to:
        obtain the air pressure data measured by the plurality of pressure sensors; and
        adjust the operating configuration of the cooling unit based on a cooling specification and a comparison of the obtained air pressure data measured by the first pressure sensor and the second pressure sensor.

13. The rack unit of claim 12, wherein the cooling specification comprises:
minimization of power consumption of the cooling unit while maintaining a predetermined temperature of the portion of the circuit board.

14. The rack unit of claim 12, wherein the cooling specification comprises:
minimization of power consumption of the cooling unit while maintaining the comparison of the obtained air pressure data from the first pressure sensor and the second pressure sensor at a predetermined pressure difference.

15. The rack unit of claim 12, wherein the cooling specification comprises:
minimization of power consumption of the cooling unit while maintaining a predetermined air flow across the portion of the circuit board.

16. The rack unit of claim 12, wherein the sensor processing unit configured to adjust the operating configuration of the cooling unit based on a cooling specification and a comparison of the obtained air pressure data measured by the first pressure sensor and the second pressure sensor comprises:
the sensor processing unit configured to adjust the operating configuration of the cooling unit such that at least one fan of the cooling unit runs at a different speed setting from another fan of the cooling unit.

17. A method of operating a cooling unit which includes a plurality of fans, the method comprising:
obtaining, by a processor, air pressure data measured by a plurality of pressure sensors disposed within a rack unit, wherein the processor is coupled with the plurality of pressure sensors, and wherein the plurality of pressure sensors includes:
a first pressure sensor located between a portion of a circuit board and a cooling unit which generates airflow over the circuit board, the first pressure sensor configured to measure air pressure data at a location of the first pressure sensor; and
a second pressure sensor located such that the portion of the circuit board is between the second pressure sensor and the cooling unit, the second pressure sensor configured to measure air pressure data at a location of the second pressure sensor; and
adjusting, by the processor, an operating configuration of the cooling unit based on a cooling specification and a comparison of the obtained air pressure data measured by the first pressure sensor and the second pressure sensor.

18. The method as recited in claim 17, wherein the adjusting, by the processor, the operating configuration of the cooling unit based on a cooling specification and a comparison of the obtained air pressure data measured by the first pressure sensor and the second pressure sensor comprises:
adjusting, by the processor, the operating configuration of the cooling unit to achieve a target air flow for the portion of the circuit board and a second target air flow for a second portion of the circuit board, and wherein the target air flow and the second target air flow are different.

19. The method as recited in claim 17, wherein the adjusting, by the processor, the operating configuration of the cooling unit based on a cooling specification and a comparison of the obtained air pressure data measured by the first pressure sensor and the second pressure sensor comprises:
adjusting, by the processor, the operating configuration of the cooling unit based on the cooling specification, wherein the operating configuration specifies independent speed settings for each of the fans of the cooling unit, and wherein at least two of the independent speed settings are different from one another.

20. The method as recited in claim 17, wherein the adjusting, by the processor, the operating configuration of the cooling unit based on a cooling specification and a comparison of the obtained air pressure data measured by the first pressure sensor and the second pressure sensor comprises:
adjusting, by the processor, the operating configuration of the cooling unit based on the cooling specification, wherein the cooling specification varies in a predetermined relationship to a load of a second processor which is disposed on the circuit board.

21. The method as recited in claim 17, wherein the adjusting, by the processor, the operating configuration of the cooling unit based on a cooling specification and a comparison of the obtained air pressure data measured by the first pressure sensor and the second pressure sensor comprises:
adjusting, by the processor, the operating configuration of the cooling unit based on the cooling specification to minimize power consumption of the cooling unit while maintaining a predetermined temperature of the portion of the circuit board.

22. The method as recited in claim 17, wherein the adjusting, by the processor, the operating configuration of the cooling unit based on a cooling specification and a comparison of the obtained air pressure data measured by the first pressure sensor and the second pressure sensor comprises:
adjusting, by the processor, the operating configuration of the cooling unit based on the cooling specification to minimize power consumption of the cooling unit while maintaining the comparison of the obtained air pressure data from the first pressure sensor and the second pressure sensor at a predetermined pressure difference.

23. The method as recited in claim 17, wherein the adjusting, by the processor, the operating configuration of the cooling unit based on a cooling specification and a comparison of the obtained air pressure data measured by the first pressure sensor and the second pressure sensor comprises:
adjusting, by the processor, the operating configuration of the cooling unit based on the cooling specification to minimize power consumption of the cooling unit while maintaining a predetermined air flow across the portion of the circuit board.

* * * * *